United States Patent
Khlebnikov et al.

(10) Patent No.: US 12,473,661 B2
(45) Date of Patent: Nov. 18, 2025

(54) LARGE DIAMETER SILICON CARBIDE WAFERS

(71) Applicant: Wolfspeed, Inc., Durham, NC (US)

(72) Inventors: Yuri Khlebnikov, Raleigh, NC (US); Varad R. Sakhalkar, Morrisville, NC (US); Caleb A. Kent, Durham, NC (US); Valeri F. Tsvetkov, Durham, NC (US); Michael J. Paisley, Raleigh, NC (US); Oleksandr Kramarenko, Durham, NC (US); Matthew David Conrad, Durham, NC (US); Eugene Deyneka, Raleigh, NC (US); Steven Griffiths, Morrisville, NC (US); Simon Bubel, Carrboro, NC (US); Adrian R. Powell, Cary, NC (US); Robert Tyler Leonard, Raleigh, NC (US); Elif Balkas, Cary, NC (US); Jeffrey C. Seaman, Louisburg, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/762,896

(22) Filed: Jul. 3, 2024

(65) Prior Publication Data
US 2024/0352622 A1 Oct. 24, 2024

Related U.S. Application Data

(63) Continuation of application No. 17/124,810, filed on Dec. 17, 2020, now Pat. No. 12,054,850.
(Continued)

(51) Int. Cl.
*H01L 21/04* (2006.01)
*C30B 23/02* (2006.01)
(Continued)

(52) U.S. Cl.
CPC .............. *C30B 29/36* (2013.01); *C30B 23/02* (2013.01); *C30B 23/063* (2013.01);
(Continued)

(58) Field of Classification Search
CPC ........... H01L 21/02002; H01L 21/0475; H01L 21/02378; H01L 21/02529; H01L 29/1608;
(Continued)

(56) References Cited

U.S. PATENT DOCUMENTS

| 6,045,613 A | 4/2000 | Hunter |
|---|---|---|
| 6,218,680 B1 | 4/2001 | Carter, Jr. et al. |

(Continued)

FOREIGN PATENT DOCUMENTS

| CN | 109321980 | 2/2019 |
|---|---|---|
| EP | 2192211 | 6/2010 |

(Continued)

OTHER PUBLICATIONS

Author Unknown, "Guide for Metrology for Measuring Thickness, Total Thickness Variation, Bow, Warp/Sori, and Flatness of Bonded Wafer Stacks," SEMI 3D4-0915, Sep. 2015, SEMI, Milpitas, California, 41 pages.

(Continued)

*Primary Examiner* — Jaehwan Oh
(74) *Attorney, Agent, or Firm* — Dority & Manning, P.A.

(57) ABSTRACT

Silicon carbide (SiC) wafers and related methods are disclosed that include large diameter SiC wafers with wafer shape characteristics suitable for semiconductor manufacturing. Large diameter SiC wafers are disclosed that have reduced deformation related to stress and strain effects associated with forming such SiC wafers. As described herein, wafer shape and flatness characteristics may be improved by reducing crystallographic stress profiles during (Continued)

growth of SiC crystal boules or ingots. Wafer shape and flatness characteristics may also be improved after individual SiC wafers have been separated from corresponding SiC crystal boules. In this regard, SiC wafers and related methods are disclosed that include large diameter SiC wafers with suitable crystal quality and wafer shape characteristics including low values for wafer bow, warp, and thickness variation.

20 Claims, 23 Drawing Sheets

Related U.S. Application Data

(60) Provisional application No. 62/954,082, filed on Dec. 27, 2019.

(51) Int. Cl.
    *C30B 23/06*     (2006.01)
    *C30B 29/36*     (2006.01)
    *C30B 31/22*     (2006.01)
    *C30B 33/02*     (2006.01)

(52) U.S. Cl.
    CPC ............ *C30B 23/066* (2013.01); *C30B 31/22* (2013.01); *C30B 33/02* (2013.01); *H01L 21/0475* (2013.01)

(58) Field of Classification Search
    CPC ... H01L 21/02447; C30B 29/36; C30B 33/00; C30B 23/00
    See application file for complete search history.

(56) References Cited

U.S. PATENT DOCUMENTS

| | | | |
|---|---|---|---|
| 6,396,080 B2 | 5/2002 | Carter, Jr. et al. | |
| 6,403,982 B2 | 6/2002 | Carter, Jr. et al. | |
| 6,639,247 B2 | 10/2003 | Carter, Jr. et al. | |
| 6,749,685 B2 | 6/2004 | Coleman | |
| 7,147,715 B2 | 12/2006 | Malta et al. | |
| 7,192,482 B2 | 3/2007 | Mueller et al. | |
| 7,276,117 B2 | 10/2007 | Basceri et al. | |
| 7,294,324 B2 | 11/2007 | Powell et al. | |
| 7,300,519 B2 | 11/2007 | Tsvetkov et al. | |
| 7,314,521 B2 | 1/2008 | Powell et al. | |
| 7,316,747 B2 | 1/2008 | Jenny et al. | |
| 7,323,051 B2 | 1/2008 | Hobgood et al. | |
| 7,323,052 B2 | 1/2008 | Tsvetkov et al. | |
| 7,351,286 B2 | 4/2008 | Leonard et al. | |
| 7,364,617 B2 | 4/2008 | Mueller et al. | |
| 7,387,680 B2 | 6/2008 | Tsvetkov et al. | |
| 7,422,634 B2 | 9/2008 | Powell et al. | |
| 7,547,897 B2 | 6/2009 | Suvorov | |
| 7,563,321 B2 | 7/2009 | Powell et al. | |
| 7,601,441 B2 | 10/2009 | Jenny et al. | |
| 8,147,991 B2 | 4/2012 | Jenny et al. | |
| 8,384,090 B2 | 2/2013 | Powell et al. | |
| 8,618,552 B2 | 12/2013 | Powell et al. | |
| 8,785,946 B2 | 7/2014 | Powell et al. | |
| 8,980,445 B2 | 3/2015 | Leonard et al. | |
| 9,018,639 B2 | 4/2015 | Loboda et al. | |
| 9,099,308 B2* | 8/2015 | Abbondanza | H01L 21/02532 |
| 9,099,377 B2 | 8/2015 | Basceri et al. | |
| 9,165,779 B2 | 10/2015 | Loboda et al. | |
| 9,200,381 B2 | 12/2015 | Leonard et al. | |
| 9,790,619 B2 | 10/2017 | Leonard et al. | |
| 9,966,249 B2 | 5/2018 | Tanaka et al. | |
| 10,090,153 B2* | 10/2018 | Hawryluk | B23K 26/0738 |
| 10,472,715 B2 | 11/2019 | Nemoto et al. | |
| 10,611,052 B1* | 4/2020 | Bubel | H10D 62/8325 |
| 10,867,797 B2 | 12/2020 | Suvorov et al. | |
| 11,236,438 B2* | 2/2022 | Vogel | C30B 23/00 |
| 11,342,418 B2* | 5/2022 | Okita | C30B 29/36 |
| 11,984,480 B2 | 5/2024 | Enokizono et al. | |
| 2003/0233975 A1 | 12/2003 | Jenny et al. | |
| 2006/0225645 A1* | 10/2006 | Powell | C30B 23/00 257/E21.054 |
| 2006/0278891 A1* | 12/2006 | Saxler | C30B 29/403 438/285 |
| 2013/0153928 A1 | 6/2013 | Leonard et al. | |
| 2014/0117380 A1* | 5/2014 | Loboda | H01L 21/02008 438/692 |
| 2014/0264384 A1* | 9/2014 | Loboda | H01L 21/02378 257/77 |
| 2014/0291698 A1 | 10/2014 | Powell et al. | |
| 2015/0068457 A1 | 3/2015 | Drachev et al. | |
| 2017/0204532 A1* | 7/2017 | Land | C04B 35/571 |
| 2017/0321345 A1 | 11/2017 | Xu et al. | |
| 2017/0323790 A1* | 11/2017 | Ward | C30B 29/06 |
| 2018/0187332 A1 | 7/2018 | Powell et al. | |
| 2019/0157087 A1* | 5/2019 | Akiyama | H01L 21/02 |
| 2019/0245044 A1 | 8/2019 | Hori | |
| 2020/0071847 A1 | 3/2020 | Vogel et al. | |
| 2020/0152528 A1 | 5/2020 | Nishihara | |
| 2020/0388683 A1* | 12/2020 | Okita | C30B 33/06 |
| 2021/0104604 A1* | 4/2021 | Lin | H01L 21/02458 |
| 2022/0090296 A1* | 3/2022 | Vogel | C30B 23/00 |

FOREIGN PATENT DOCUMENTS

| | | |
|---|---|---|
| EP | 3382067 | 10/2018 |
| JP | 2016-060688 A | 4/2016 |
| WO | WO 2017/053883 A1 | 3/2017 |
| WO | WO 2020/049731 A1 | 3/2020 |

OTHER PUBLICATIONS

Author Unknown, "Test Method for Measurement of Thickness and Shape of Crystalline Sapphire Wafers by Using Optical Probes," SEMI HB6-0316, Mar. 2016, SEMI, Milpitas, California, 20 pages.

Author Unknown, "Test Method for Measuring Bow and Warp on Silicon Wafers by Automated Noncontact Scanning," SEMI MF1390-0218, Feb. 2018, SEMI, Milpitas, California, 12 pages.

Author Unknown, "Test Method for Measuring Flatness, Thickness, and Total Thickness Variation on Silicon Wafers by Automated Noncontact Scanning," SEMI MF1530-0707, Oct. 2018, SEMI, Milpitas, California, 12 pages.

Author Unknown, "Test Method for Measuring Sori on Silicon Wafers by Automated Noncontact Scanning," SEMI MF1451-0707, Mar. 2019, SEMI, Milpitas, California, 11 pages.

Author Unknown, "Wafer Flatness," Specifications, wafertech.co.uk, accessed as early as Jul. 22, 2019, Wafer Technology Ltd, 1 page.

Chen, Xiufang, et al., "Relaxation of Residual Stresses in SiC Wafers by Annealing," Rare Metals, vol. 25, Issue 6. Dec. 2006, 5 pages.

Cree, Inc., "Cree Silicon Carbide Substrates and Epitaxy," MAT-CATALOG.00Q, 2013, 17 pages.

Goldstein, M., et al., "450 mm Silicon Wafer Challenges—Wafer Thickness Scaling," ECS Transactions, vol. 16, Issue 6, Oct. 2008, The Electrochemical Society, pp. 3-13.

International Search Report and Written Opinion for International Patent Application No. PCT/US2021/063238, mailed Jun. 7, 2022, 22 pages.

International Search Report and Written Opinion for International Patent Application No. PCT/US2020/065520, mailed Apr. 9, 2021, 19 pages.

Invitation to Pay Additional Fees and Partial Search for International Patent Application No. PCT/US2021/063238, mailed Apr. 14, 2022, 18 pages.

Ma, R.-H., et al., "Thermal System Design and Dislocation Reduction for Growth of Wide Band Gap Crystals: Application to SiC Growth," Journal of Crystal Growth, vol. 258, Nov. 2003, Elsevier B.V., pp. 318-330.

Nakamura, et al., "Ultrahigh-Quality Silicon Carbide Single Crystals," Nature, vol. 430, Issue 7003, Aug. 2004, Nature Publishing Group, pp. 1009-1012.

(56) References Cited

OTHER PUBLICATIONS

Office Action for Taiwanese Patent Application No. 109146203, mailed July 8, 2022, 3 pages.
Office Action for Taiwanese Patent Application No. 109146203, mailed Aug. 13, 2021, 13 pages.
Stockmeier, M., et al., "On the Lattice Parameters of Silicon Carbide," Journal of Applied Physics, vol. 105, 2009, 4 pages.

* cited by examiner

FP - FOCAL PLANE
$A_{MAX}$ - MAXIMUM DISTANCE ABOVE FP
$B_{MAX}$ - MAXIMUM DISTANCE BELOW FP
WARP = $|A_{MAX}| + |B_{MAX}|$

FP - FOCAL PLANE
CP - CENTER POINT OF WATER SURFACE
BOW - DISTANCE BETWEEN FP AND CP

FS - FRONT SURFACE OF WAFER
BS - BACK SURFACE OF WAFER
MAX - MAXIMUM ELEVATION ABOVE BS
MIN - MINIMUM ELEVATION ABOVE BS
TTV - DIFFERENCE BETWEEN MAX AND MIN $L_{MAX}$ - LOCAL MAXIMUM ELEVATION
$L_{MIN}$ - LOCAL MINIMUM ELEVATION
LTV - LOCAL DIFFERENCE BETWEEN $L_{MAX}$ AND $L_{MIN}$

LFP - LOCALIZED FOCAL PLANE
$A_{MAX}$ - MAXIMUM DISTANCE ABOVE LFP
$B_{MAX}$ - MAXIMUM DISTANCE BELOW LFP
$SFQR = |A_{MAX}| + |B_{MAX}|$

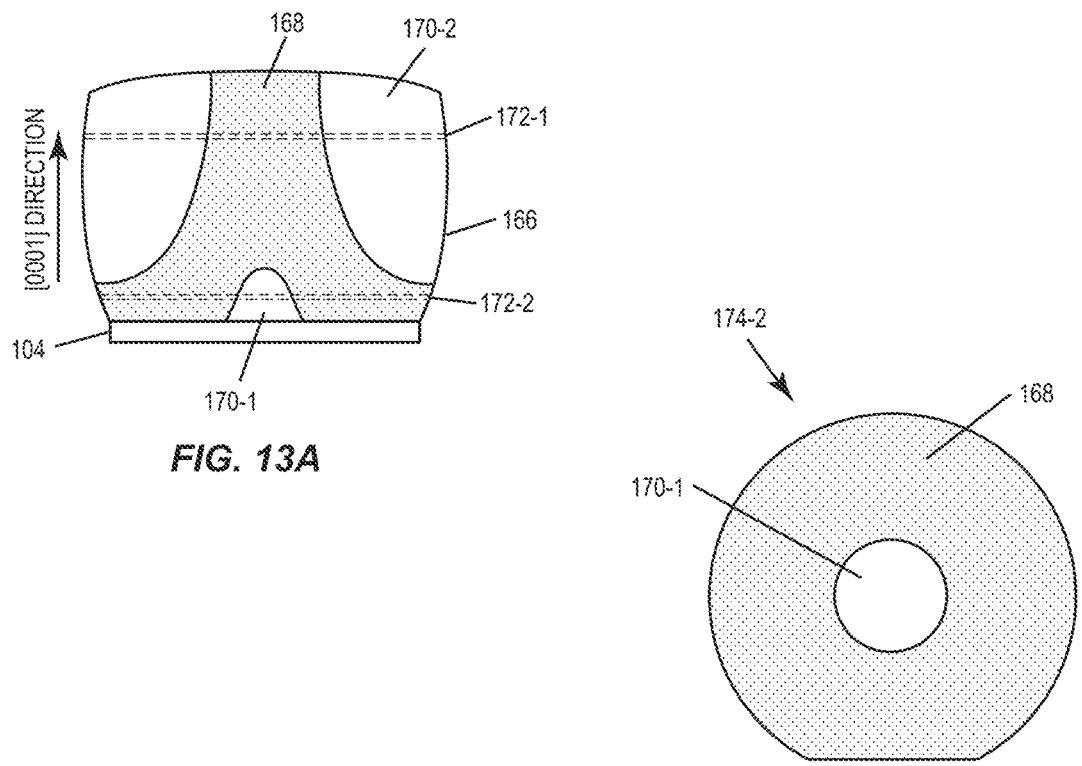
FIG. 13A
FIG. 13B
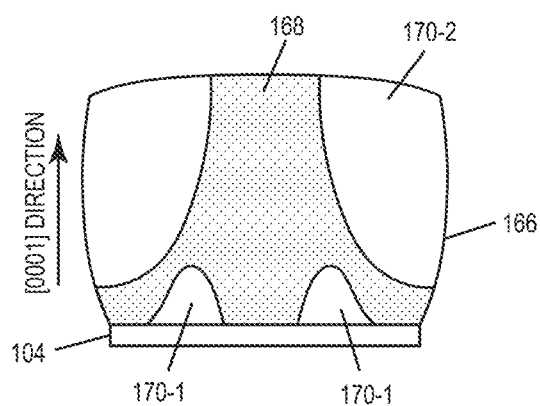
FIG. 14

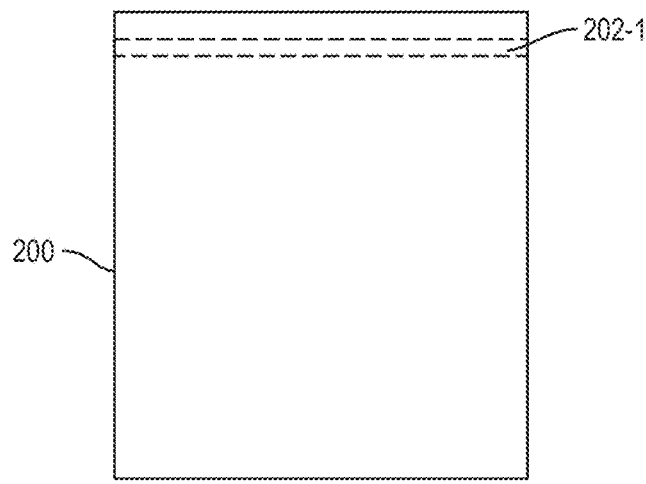
FIG. 23A    FIG. 23B
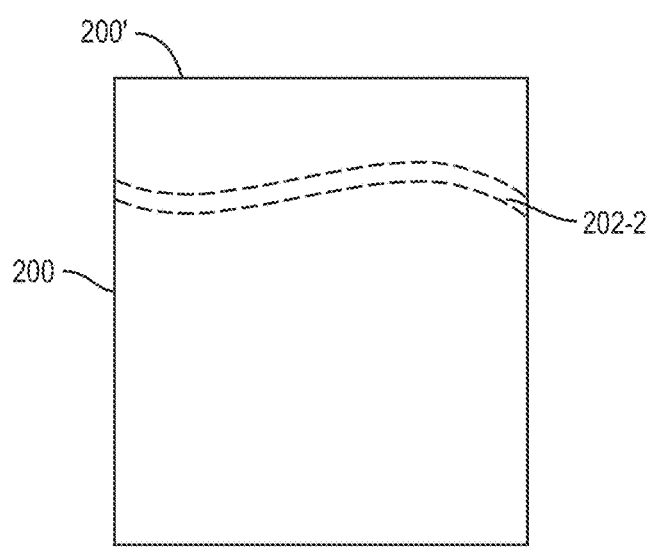
FIG. 23C    FIG. 23D

LARGE DIAMETER SILICON CARBIDE WAFERS

RELATED APPLICATIONS

This application is a continuation of and claims the benefit of U.S. application Ser. No. 17/124,810, filed on Dec. 17, 2020, the disclosure of which is incorporated by reference in its entirety. This application claims the benefit of provisional patent application Ser. No. 62/954,082, filed Dec. 27, 2019, the disclosure of which is hereby incorporated herein by reference in its entirety.

FIELD OF THE DISCLOSURE

The present disclosure relates to crystalline materials, and more specifically to large diameter silicon carbide wafers.

BACKGROUND

Silicon carbide (SiC) exhibits many attractive electrical and thermophysical properties. SiC is especially useful due to its physical strength and high resistance to chemical attack as well as various electronic properties, including radiation hardness, high breakdown field, a relatively wide band gap, high saturated electron drift velocity, high temperature operation, and absorption and emission of high energy photons in the blue, violet, and ultraviolet regions of the spectrum. Compared with conventional wafer or substrate materials, including silicon and sapphire, such properties of SiC make it more suitable for the fabrication of wafers or substrates for high power density solid state devices, such as power electronic, radio frequency, and optoelectronic devices. SiC occurs in many different crystal structures called polytypes, with certain polytypes (e.g., 4H—SiC and 6H—SiC) having a hexagonal crystal structure.

While SiC exhibits superior materials properties, crystal growth techniques required to grow SiC are very different and significantly more challenging than conventional growth processes for other crystalline materials. Conventional crystalline materials utilized in semiconductor manufacturing, such as silicon and sapphire, have significantly lower melting points, allowing for direct crystal growth techniques from melted source materials that enable fabrication of large diameter crystalline materials. In contrast, bulk crystalline SiC is often produced by a seeded sublimation growth process at high temperatures where various challenges include impurity incorporation, structural defects associated with thermal and crystallographic stress, and formation of different polytypes, among others. In a typical SiC growth technique, a substrate and a source material are both placed inside of a reaction crucible. A thermal gradient created when the crucible is heated encourages vapor phase movement of the materials from the source material to the substrate followed by condensation upon the substrate and resulting bulk crystal growth. It is known that impurities can be introduced as dopants into SiC and that these dopants can regulate certain properties. For sublimation growth of SiC, a dopant can be introduced into the chamber in a variety of manners so that the dopant will be present in the SiC crystal produced from that process. The process is controlled to provide an appropriate concentration of the dopant for a particular application. Following bulk crystal growth, individual wafers of SiC may be obtained by slicing a bulk crystal ingot or boule of SiC, and the individual wafers may subsequently be subjected to additional processes, such as lapping or polishing.

The unique properties of SiC wafers enable the design and fabrication of an array of high power and/or high frequency semiconductor devices. Continuous development has led to a level of maturity in the fabrication of SiC wafers that allows such semiconductor devices to be manufactured for increasingly widespread commercial applications. As the semiconductor device industry continues to mature, SiC wafers having larger usable diameters are desired. Usable diameters of SiC wafers can be limited by certain structural defects in the material composition of SiC as well as certain wafer shape characteristics. Structural defects in the material composition may include micropipes, dislocations (e.g., threading, edge, screw and/or basal plane dislocations), hexagonal voids, and stacking faults, among others. Wafer shape characteristics associated with SiC may include warp, bow, and thickness variation that can alter wafer flatness. These various structural defects and wafer shape characteristics can contribute to crystallographic stresses that can be detrimental to fabrication and proper operation of semiconductor devices subsequently formed on conventional SiC wafers. Such crystallographic stresses are generally proportional to the radius of the wafer squared and as a result, it is difficult to economically fabricate larger diameter SiC semiconductor wafers of high quality.

The art continues to seek improved SiC wafers with larger diameters and related solid-state devices while overcoming challenges associated with conventional SiC wafers.

SUMMARY

Silicon carbide (SiC) wafers and related methods are disclosed that include large diameter SiC wafers with wafer shape characteristics suitable for semiconductor manufacturing. Large diameter SiC wafers are disclosed that have reduced deformation. The deformation may be related to stress and strain effects associated with forming such SiC wafers. As described herein, wafer shape and flatness characteristics may be improved by reducing crystallographic stress profiles during growth of SiC crystal boules or ingots. Wafer shape and flatness characteristics may also be improved after individual SiC wafers have been separated from corresponding SiC crystal boules. In this regard, SiC wafers and related methods are disclosed that include large diameter SiC wafers with suitable crystal quality and wafer shape characteristics including low values for wafer bow, warp, and thickness variation.

In one aspect, a SiC wafer comprises a diameter of at least 195 millimeters (mm), a thickness in a range from 300 microns (μm) to 1000 μm, and a bow in a range from −25 μm to 25 μm. In certain embodiments, the SiC wafer further comprises a warp of less than or equal to 40 μm. In certain embodiments, the diameter is in a range from 195 mm to 455 mm, or in a range from 195 mm to 305 mm. In certain embodiments, the thickness is in a range from 100 μm to 500 μm, or in a range from 200 μm to 500 μm. In certain embodiments, the SiC wafer comprises a total thickness variation (TTV) of less than 7 μm, or less than 2.6 μm. In certain embodiments, the SiC wafer comprises a local thickness variation (LTV) of less than 4 μm for a site area of 1 $cm^2$. In certain embodiments, the SiC wafer comprises a site front least-squares range (SFQR) maximum value of less than 1.5 μm for a site area of 1 $cm^2$. In certain embodiments, the SiC wafer comprises 4-H SiC. The SiC wafer may comprise semi-insulating SiC or n-type SiC. For n-type SiC, the SiC may comprise nitrogen as an n-type dopant. In certain embodiments, the n-type dopant forms a higher doping region and a lower doping region such that the higher doping region is laterally bounded by the lower doping region. The higher doping region may be registered with a central region of the SiC wafer or the higher doping region may be offset from a central region of the SiC wafer. In certain embodiments, the SiC wafer further comprises at least one of boron, aluminum, germanium, beryllium, gallium, tin, arsenic, phosphorus, titanium, and vanadium.

In another aspect, a method comprises: growing a crystalline material of SiC; and separating a SiC wafer from the crystalline material of SiC to form the SiC wafer with a diameter of at least 195 mm, a thickness in a range from 300 µm to 1000 µm, and a bow in a range from −25 µm to 25 µm. In certain embodiments, the SiC wafer comprises a warp of less than or equal to 40 µm. In certain embodiments, the diameter is in a range from 195 mm to 455 mm. In certain embodiments, growing the crystalline material of SiC comprises controlling radial bulk material properties by reducing a radial thermal gradient across the crystalline material of SiC during growth; or increasing a radial thermal gradient across the crystalline material of SiC during growth. In certain embodiments, growing the crystalline material of SiC comprises forming increased crystal defects along peripheral portions of the SiC wafer. In certain embodiments, the method further comprises annealing the SiC wafer while a mechanical load is applied to the SiC wafer. In certain embodiments, the method further comprises selectively implanting the SiC wafer along peripheral portions of a carbon face of the SiC wafer. In certain embodiments, the method further comprises annealing the SiC wafer after selectively implanting the SiC wafer. In certain embodiments, the method further comprises selectively depositing a film along peripheral portions of a carbon face of the SiC wafer. In certain embodiments, the method further comprises annealing the SiC wafer after selectively depositing the film. In certain embodiments, the method further comprises removing the film after annealing the SiC wafer.

In certain embodiments, separating the SiC wafer comprises variably adjusting a cutting depth across the crystalline material based on a defect profile of the crystalline material. In certain embodiments, separating the SiC wafer comprises variably adjusting a cutting depth across the crystalline material based on a doping profile of the crystalline material. In certain embodiments, separating the SiC wafer comprises variably adjusting a cutting depth across the crystalline material based on a wafer shape characteristic of another SiC wafer that was previously separated from the crystalline material. In certain embodiments, separating the SiC wafer comprises variably adjusting a cutting depth across the crystalline material based on a shape of a top surface of the crystalline material.

In another aspect, a method comprises: providing a SiC wafer that forms a first wafer shape; applying a mechanical load to the SiC wafer; and annealing the SiC wafer during application of the mechanical load such that the SiC wafer forms a second wafer shape that is different than the first wafer shape. In certain embodiments, the mechanical load is applied to one or more localized portions of the SiC wafer. In other embodiments, the mechanical load is applied to an entirety of the SiC wafer. In certain embodiments, the SiC wafer is supported by an edge-supported arrangement during application of the mechanical load. In certain embodiments, the second shape of the SiC wafer comprises a diameter in a range from 195 mm to 455 mm, a thickness of no more than 500 µm, a bow of no more than 25 µm, and a warp of no more than 40 µm. In certain embodiments, the diameter is in a range from 195 mm to 305 mm.

In another aspect, a SiC wafer comprises a diameter of at least 195 mm, a thickness in a range from 500 µm to 2000 µm, and a bow in a range from −25 µm to 25 µm. In certain embodiments, the thickness is in a range from 500 µm to 1500 µm. In certain embodiments, the SiC wafer further comprises a warp of less than or equal to 40 µm. In certain embodiments, the diameter is in a range from 195 mm to 455 mm. In certain embodiments, the diameter is in a range from 195 mm to 305 mm.

In another aspect, a SiC wafer comprises a diameter of at least 195 mm, a diameter to thickness ratio of at least 500, and a bow in a range from −25 µm to 25 µm. In certain embodiments, the SiC wafer further comprises a warp of less than or equal to 40 µm. In certain embodiments, the diameter is in a range from 195 mm to 305 mm. In certain embodiments, the diameter to thickness ratio is at least 600. In certain embodiments, the diameter to thickness ratio is at least 900.

In another aspect, a SiC wafer comprises a diameter of at least 195 mm, a thickness in a range from 475 µm to 525 µm, and a maximum edge-supported deflection value of less than or equal to 150 µm. In certain embodiments, the maximum edge-supported deflection value is less than or equal to 120 µm. In certain embodiments, the maximum edge-supported deflection value is less than or equal to 110 µm. In certain embodiments, the maximum edge-supported deflection value is in a range from 110 µm to 150 µm. In certain embodiments, the maximum edge-supported deflection value is less than or equal to 50 µm, or less than or equal to 10 µm, or in a range from 5 µm to 150 µm, or in a range from 5 µm to 100 µm, or in a range from 5 µm to 50 µm, or in a range from 15 µm to 40 µm, or in a range from 5 µm to 20 µm. In certain embodiments, the SiC wafer further comprises an edge-supported bow value in a range from −5 µm to −20 µm. In certain embodiments, the diameter is in a range from 195 mm to 305 mm.

In another aspect, a method comprises: growing a crystalline material of SiC at a growth temperature while maintaining stress for at least twenty percent of the crystalline material below a critical resolved shear stress for SiC at the growth temperature; and separating a SiC wafer from the crystalline material of SiC to form the SiC wafer with a diameter of at least 195 mm. In certain embodiments, growing the crystalline material of SiC comprises maintaining stress for at least forty percent of the crystalline material below the critical resolved shear stress for SiC. In certain embodiments, growing the crystalline material of SiC comprises maintaining stress for at least eighty percent of the crystalline material below the critical resolved shear stress for SiC. In certain embodiments, the SiC wafer comprises a thickness in a range from 300 µm to 1000 µm, and a bow in a range from −25 µm to 25 µm. In certain embodiments, the diameter is in a range from 195 mm to 305 mm. In certain embodiments, the diameter is in a range from 195 mm to 455 mm.

In another aspect, a method comprises: growing a crystalline material of SiC; and separating a SiC wafer from the crystalline material of SiC by variably adjusting a cutting depth across the crystalline material to form the SiC wafer with a diameter of at least 195 mm, and a bow in a range from −25 µm to 25 µm. In certain embodiments, the diameter of the SiC wafer is in a range from 195 mm to 305 mm. In certain embodiments, the diameter of the SiC wafer is in a range from 195 mm to 455 mm. In certain embodiments, the SiC wafer comprises a thickness in a range from 300 µm to 1000 µm. In certain embodiments, separating the SiC wafer comprises variably adjusting the cutting depth across the crystalline material based on a defect profile of the crystalline material. In certain embodiments, separating the SiC wafer comprises variably adjusting the cutting depth across the crystalline material based on a doping profile of the crystalline material. In certain embodiments, separating the SiC wafer comprises variably adjusting the cutting depth across the crystalline material based on a wafer shape characteristic of another SiC wafer that was previously separated from the crystalline material. In certain embodiments, separating the SiC wafer comprises variably adjusting the cutting depth across the crystalline material based on a shape of a top surface of the crystalline material. In certain embodiments, separating the SiC wafer comprises laser-assisted separation of the crystalline material. In certain embodiments, separating the SiC wafer comprises sawing of the crystalline material.

In another aspect, a method comprises: growing a crystalline material of SiC; characterizing the crystalline material of SiC or an initial SiC wafer that has been separated from the crystalline material of SiC to determine one or more of a crystallographic defect profile, a doping profile, a crystallographic stress profile, and a shape; and separating a subsequent SiC wafer from the crystalline material of SiC by variably adjusting a cutting depth across the crystalline material based on the one or more of the crystallographic defect profile, the doping profile, the crystallographic stress profile, and the shape. In certain embodiments, the subsequent SiC wafer comprises a diameter of at least 195 mm, and a bow in a range from −25 µm to 25 µm. In certain embodiments, the shape comprises a wafer shape characteristic of the initial SiC wafer. In certain embodiments, the shape comprises a shape of a top surface of the crystalline material before the subsequent SiC wafer is separated. In certain embodiments, separating the subsequent SiC wafer comprises laser-assisted separation of the crystalline material. In certain embodiments, separating the subsequent SiC wafer comprises sawing of the crystalline material.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A and FIG. 1B illustrate a process of growing crystalline silicon carbide (SiC) according to embodiments disclosed herein.

FIG. 2 includes a first frame providing a perspective view of a crystalline ingot received by a conventional wire saw tool and being subjected to a wire sawing process, and a second frame providing a perspective view of multiple wafers obtained by the wire sawing process.

FIG. 13A is a side cross-sectional schematic view of SiC crystalline material on the seed crystal, showing a first lower doping region that is laterally bounded by a higher doping region near the seed crystal, followed by the higher doping region being laterally bounded by a second lower doping region.

FIG. 13B is a top schematic view of a SiC wafer derived from the SiC crystalline material of FIG. 13A along a cross-sectional portion thereof.

FIG. 14 is a side cross-sectional schematic view of SiC crystalline material on the seed crystal, showing multiple first lower doping regions that are laterally bounded by a higher doping region near the seed crystal, followed by the higher doping region being laterally bounded by a second lower doping region.

FIG. 23A is a side cross-sectional schematic view of a SiC crystal boule with superimposed dashed lines indicating the location of a SiC wafer that may be separated from the SiC crystal boule.

FIG. 23B is a side cross-sectional schematic view of the SiC wafer of FIG. 23A after separation.

FIG. 23C is a side cross-sectional schematic view of the SiC crystal boule of FIG. 23A with superimposed dashed lines indicating a location of a SiC wafer that may be separated from the SiC crystal boule by a variable separation technique.

FIG. 23D is a side cross-sectional schematic view of the SiC wafer of FIG. 23C after separation.

DETAILED DESCRIPTION

Figure 1A:
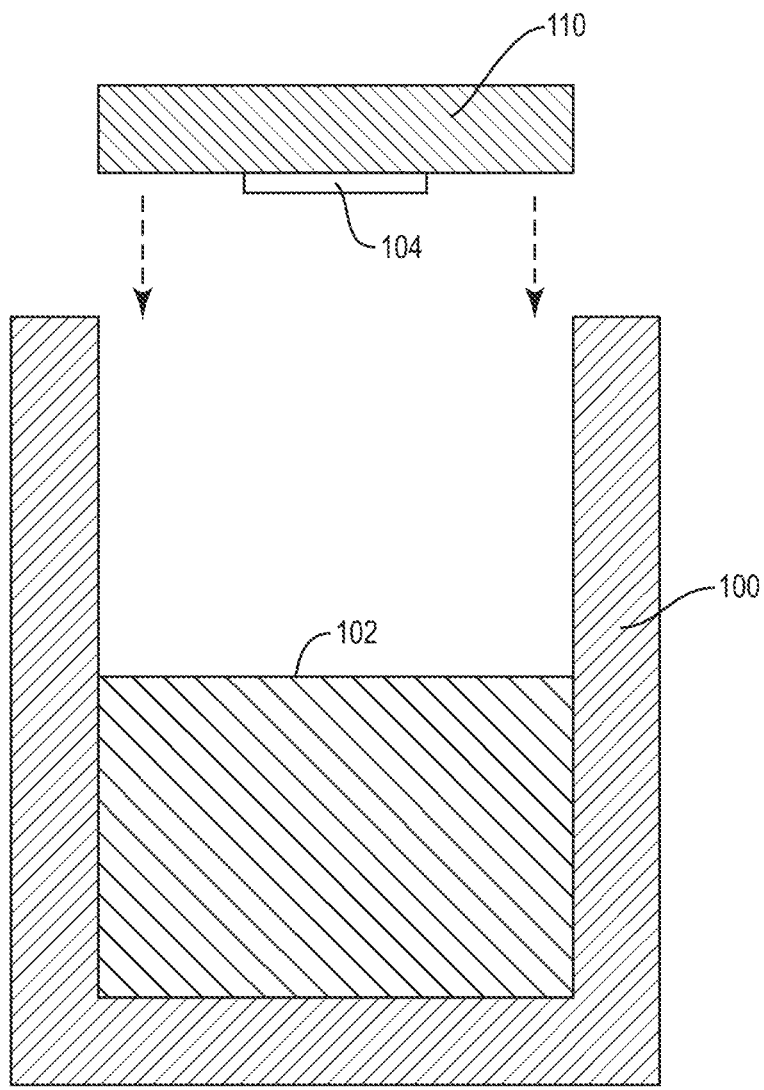

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Silicon carbide (SiC) wafers and related methods are disclosed that include large diameter SiC wafers with wafer shape characteristics suitable for semiconductor manufacturing. Large diameter SiC wafers are disclosed that have reduced deformation related to stress and strain effects associated with forming such SiC wafers. As described herein, wafer shape and flatness characteristics may be improved by reducing crystallographic stress profiles during growth of SiC crystal boules or ingots. Wafer shape and flatness characteristics may also be improved after individual SiC wafers have been separated from corresponding SiC crystal boules. In this regard, SiC wafers and related methods are disclosed that include large diameter SiC wafers with suitable crystal quality and wafer shape characteristics including low values for wafer bow, warp, and thickness variation.

SiC can be a very challenging crystalline material to grow since at normal pressures it does not have a liquid state but instead converts directly from a solid to a gas and back to a solid. This makes it different from most materials in that liquid phase growth is not available. Another major challenge for SiC crystal growth is the very low stacking fault energy observed in SiC which makes it very easy to introduce additional planes of atoms and their associated defect structures into the crystalline lattice. This low stacking fault energy combined with the very high temperatures employed in conventional physical vapor transport growth of SiC make it challenging to maintain growth in a regime where the energy available from local stress fields is below the energy required to create stacking faults. Crystallographic stress in SiC can be controlled by many factors. Crystal height and crystal diameter can play important roles as the stress can increase proportionately to the crystal height and to the square power of the diameter. Conventional SiC growth techniques have achieved 100 and 150 millimeter (mm) diameter SiC crystals. Lengths of such SiC crystals can be limited to prevent induced crystal stress from exceeding a critical resolved shear stress for the SiC crystal where high densities of dislocations are formed. For larger diameter SiC crystals (e.g., above 150 mm) as disclosed herein, the amount the diameter is increased can disproportionately increase the crystal stress, thereby producing shorter crystal heights. In this regard, conventional crystal growth techniques are not necessarily scalable for larger diameters.

General aspects of seeded sublimation growth processes for SiC are well established. As such, those skilled in the field of crystal growth and particularly those skilled in the field of SiC growth and related systems will recognize that specific details of a given technique or process can vary depending on many relevant circumstances, processing conditions, and equipment configurations. Accordingly, the descriptions given herein are most appropriately given in a general and schematic sense with the recognition that those persons of skill in the art will be able to implement and use various embodiments disclosed herein based on the provided disclosure without undue experimentation. Additionally, those skilled in this art will recognize that SiC sublimation systems of the type described herein are commercially available in various standard configurations. Alternately, sublimation systems may be designed and implemented in custom configurations, where necessary or appropriate. Accordingly, the embodiments described herein are not limited to a particular subset of sublimation systems, or any particular system configuration. Rather, many different types and configurations of sublimation systems may be used to grow crystalline SiC material in accordance with embodiments disclosed herein.

Figure 1B:
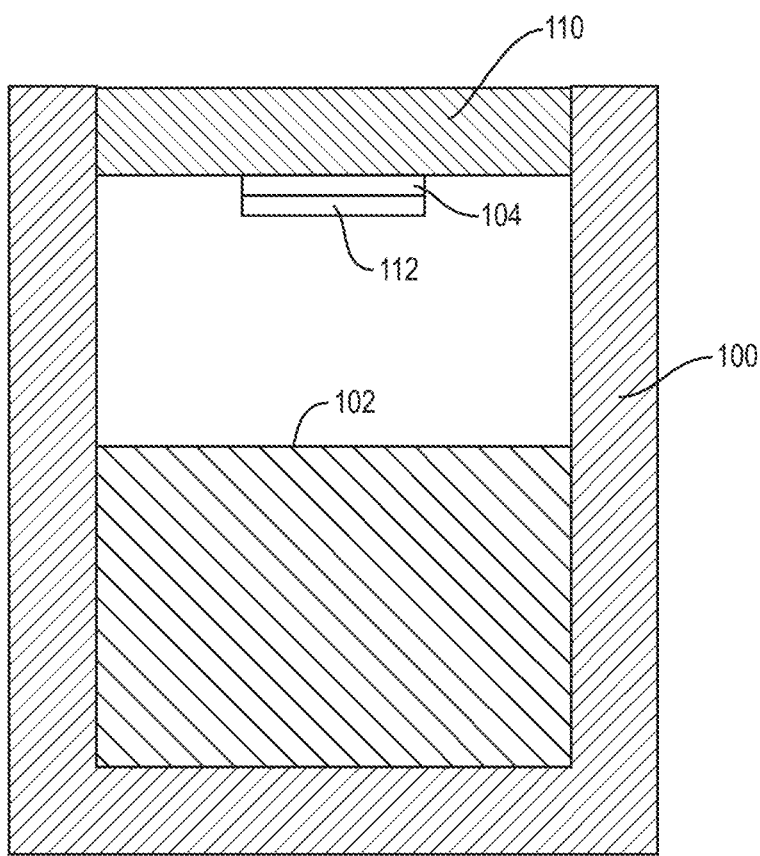

FIG. 1A and FIG. 1B illustrate a process of growing a crystal according to embodiments disclosed herein. In FIG. 1A, a crucible 100 contains source material 102 and an interior of the crucible 100 serves as a growth zone. The source material 102 may include any suitable material such as silicon, carbon, SiC, silicon compounds, carbon compounds, or combinations of any or all of the foregoing in any of various forms, including but not limited to one or more combinations of solids, powders, and gases. Other optional elements such as dopants (e.g., nitrogen, among others) and strain compensating components (e.g., germanium, tin, arsenic, and phosphorus, among others) may also be included in the source material 102. Strain compensating components, when present, are preferably either isoelectronic or have the same majority carrier type (e.g., n-type or p-type, donor or acceptor) as the dopants. Alternatively one, some, or all of the other elements can be introduced into the growth zone in ways other than inclusion in the source material 102. A seed 104, such as crystalline SiC, may be placed near a crucible lid 110 that is subsequently placed on the crucible 100 as indicated by the dashed arrows of FIG. 1A. In this manner, the seed 104 is suspended in the crucible 100 above the source material 102 as the crucible 100 is heated. In other arrangements, the seed 104 could be placed anywhere within the crucible 100, such as along bottom or side surfaces of the crucible 100.

During crystal growth, the source material 102 sublimes and forms SiC on the seed 104. Sublimation may occur when the source material 102 is heated to a temperature in a range from 1200° C. to 3000° C., or 1800° C. to 3000° C., or 1800° C. to 2500° C., or 1800° C. to 2000° C., or 2000° C. to 2200° C., among other temperature ranges. While the temperature of the source material 102 is being raised, the temperature of the growth surface of the seed 104 is likewise raised to a temperature approaching the temperature of the source material 102. Typically, the growth surface of the seed 104 is heated to a temperature in a range from 1200° C. to 3000° C., or 1800° C. to 3000° C., or 1800° C. to 2500° C., or 1700° C. to 2400° C., or 1800° C. to 2000° C., or 2000° C. to 2200° C., among other temperature ranges. During the growth process, the crucible 100 is evacuated slowly to reduce pressure. In certain embodiments, growth may be performed at a pressure in a range from 0.1 torr to 50 torr, or 0.1 torr to 25 torr, or 0.1 torr to 15 torr, or 1 torr to 15 torr, among other pressure ranges. Growth temperatures and growth pressures may generally vary with one another. For example, depending on the growth conditions, higher growth temperatures may be associated with higher growth pressures or lower growth temperatures may be associated with lower growth pressures. By maintaining the source material 102 and the growth surface of the seed 104 at their respective temperatures for a sufficient time, macroscopic growth of monocrystalline SiC of a desired polytype may form upon the seed 104.

Turning to FIG. 1B, a SiC crystal 112 is grown from sublimation of the source material 102 in the crucible 100 using a physical vapor transport process. Crystal growth takes place until growth of the SiC crystal 112 reaches a certain length. The length depends in part on the type of post-formation processing to be employed. The point where the growth of the SiC crystal 112 is stopped will also depend on such parameters as the size and type of crucible 100 and any concentration of the dopant and strain compensating component when present in the source material 102. This point can be determined in advance through experimental growths coupled with examination of the resulting SiC crystal 112 to determine concentrations of the impurities. Once the SiC crystal 112 has reached the desired size, the system may be backfilled with an inert gas to raise the pressure, and the temperature may slowly be reduced to an intermediate temperature, and then more quickly to room temperature. In certain embodiments, the intermediate temperature may be about 90%, or 80%, or 70% of the growth temperature, among other temperatures. The intermediate temperature may include a range from 150° C. to 2000° C., or 150° C. to 1200° C., or 150° C. to 500° C., or 175° C. to 225° C., among other temperature ranges. The resulting SiC crystal 112 may form a crystalline boule or ingot.

Sublimation growth of SiC can be accomplished with various growth systems, differently sized crucibles, different types of crucibles of various materials and using varying heating methods. Specific growth temperatures and pressures can be adapted by one of skill in the art to accommodate these variables. In the typical case, where such variables as the type or size of the crucible are changed, some experimental growths may need to be performed as mentioned above, to settle on the best growth conditions for a specific system. After crystal growth, the SiC crystal 112 forms a bulk crystalline material, sometimes referred to as a boule or an ingot.

Figure 2:
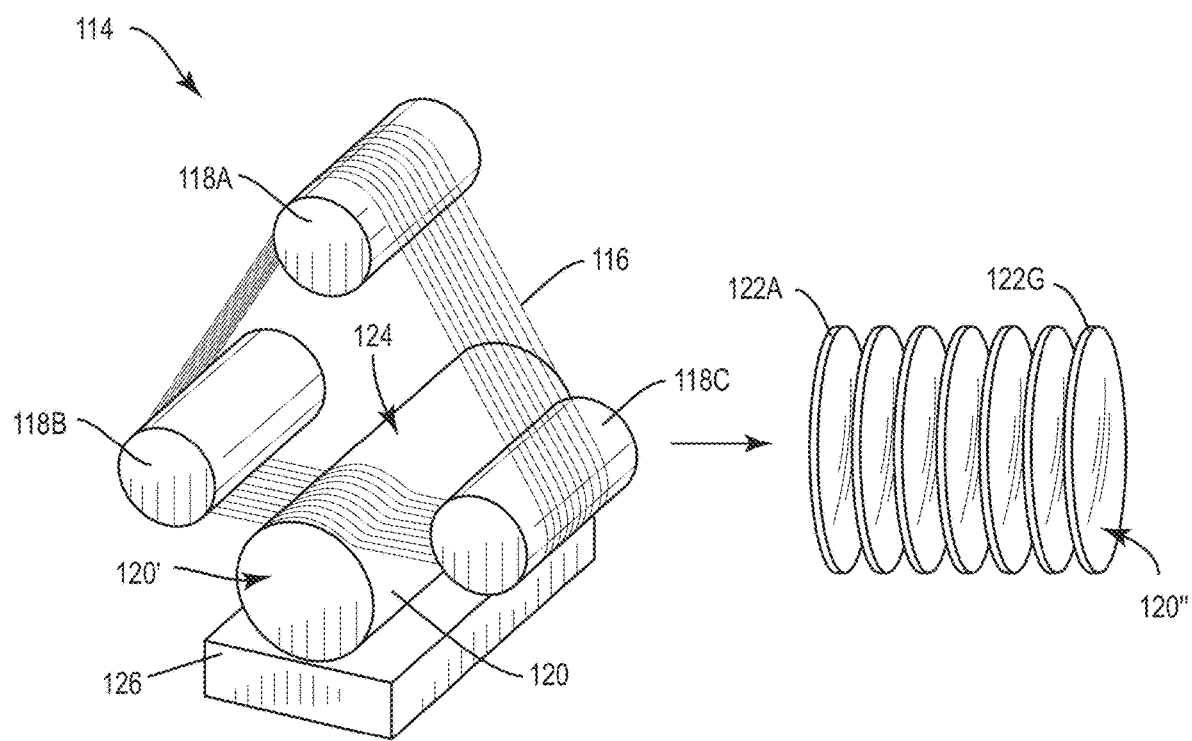

Various microelectronic, optoelectronic, and microfabrication applications require thin layers of crystalline materials as a starting structure for fabricating various useful systems. Various methods for forming thin layers of crystalline materials from bulk crystalline materials include sawing and laser-assisted separation techniques. In certain embodiments, a method for cutting thin layers (e.g., wafers or substrates) from crystalline boules or ingots involves the use of wire saws. Wire sawing technology has been applied to various crystalline materials, such as silicon (Si), sapphire, and SiC. A wire saw tool may include an ultra-fine steel wire (typically having a diameter of 0.2 mm or less) that is passed through grooves of one or many guide rollers. Two slicing methods exist, namely, loose abrasive slicing and fixed abrasive slicing. Loose abrasive slicing involves application of a slurry (typically a suspension of abrasives in oil) to a steel wire running at high speed, whereby the rolling motion of abrasives between the wire and the workpiece results in cutting of the boule or ingot. For fixed abrasive slicing, a wire fixed with diamond abrasives may be used in a method that requires only a water-soluble coolant liquid (i.e., not a slurry). High-efficiency parallel slicing permits a large number of wafers to be produced in a single slicing procedure. FIG. 2 illustrates a typical wire saw tool 114 including parallel wire sections 116 extending between rollers 118A-118C and arranged to simultaneously saw an ingot 120 into multiple thin sections (e.g., wafers 122A-122G) each having a face generally parallel to an end face 120' of the ingot 120. During the sawing process, the wire sections 116 supported by the rollers 118A-118C may be pressed in a downward direction 124 toward a holder 126 underlying the ingot 120. If the end face 120' is parallel to a crystallographic c-plane of the ingot 120, and the wire sections 116 saw through the ingot 120 parallel to the end face 120', then each resulting wafer 122A-122G will have an "on-axis" end face 120" that is parallel to the crystallographic c-plane. Wire-sawing can introduce various stresses related to the separation process that impact shapes of the resulting wafers, particularly for large-diameter wafers.

Figure 3:
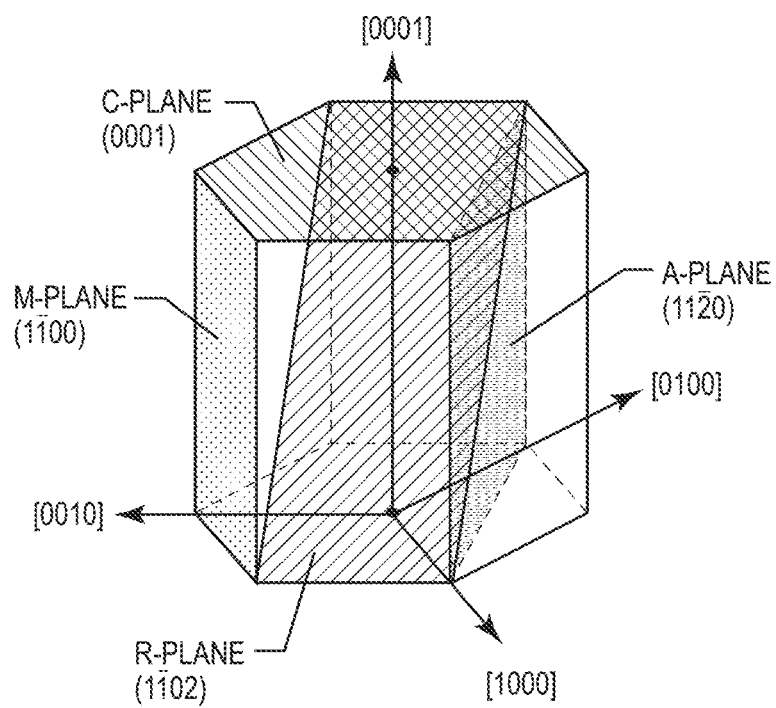
FIG. 3 is a first perspective view crystal plane diagram showing the coordinate system for a hexagonal crystal such as 4H SiC.

FIG. 3 is a first perspective view crystal plane diagram showing the coordinate system for a hexagonal crystal such as 4H—SiC, in which the c-plane ((0001) plane), corresponding to a [0001] (vertical) direction of epitaxial crystal growth, is perpendicular to both the m-plane ((1$\bar{1}$00) plane) and the a-plane ((11$\bar{2}$0) plane), and non-perpendicular with the r-plane ((1$\bar{1}$02) plane). On-axis SiC wafers having small offcut (e.g., less than half a degree from the crystallographic c-plane) are frequently employed as growth substrates for high-quality epitaxial growth of homoepitaxial layers of SiC as well as other materials (e.g., AlN and other Group III nitrides).

It is also possible to produce vicinal (also known as offcut or "off-axis") wafers having end faces that are not parallel to the crystallographic c-plane. Vicinal wafers (e.g., of SiC) having various degrees (e.g., 0.1, 0.25, 0.5, 0.75, 1, 2, 4, 6, 8, or more degrees) offcut are frequently employed as growth substrates for high-quality epitaxial growth of homoepitaxial layers of SiC as well as other materials (e.g., AlN and other Group III nitrides). Vicinal wafers may be produced either by growing a boule or ingot in a direction away from the c-axis (e.g., growing over a vicinal seed material and sawing the ingot perpendicular to the ingot sidewalls), or by growing an ingot starting with an on-axis seed material and sawing or cutting the ingot at an angle that departs from perpendicular to the ingot sidewalls.

Figure 4:
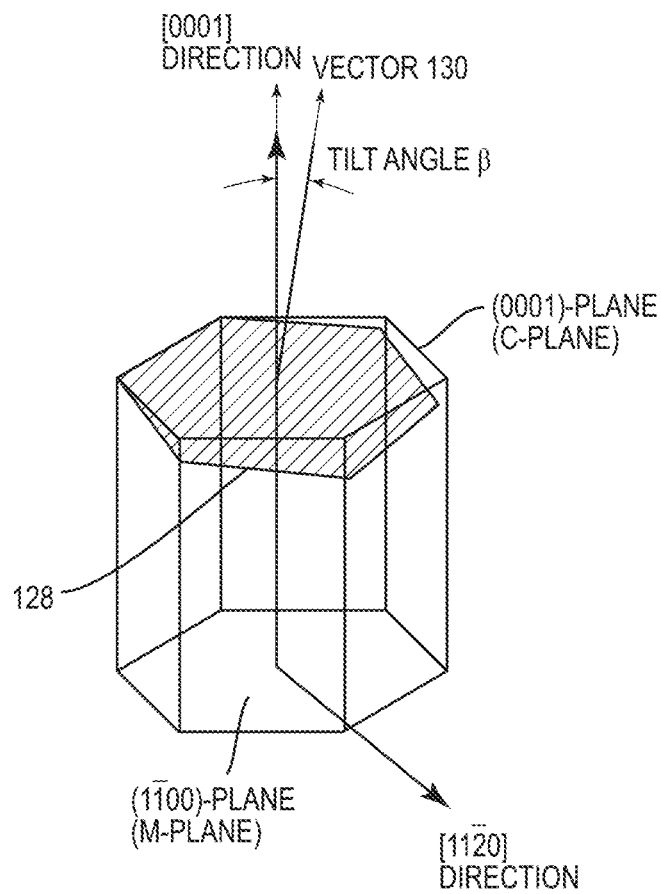
FIG. 4 is a second perspective view crystal plane diagram for a hexagonal crystal, illustrating a plane that is non-parallel to the c-plane.

FIG. 4 is a second perspective view crystal plane diagram for a hexagonal crystal, illustrating a plane 128 that is non-parallel to the c-plane, wherein a vector 130 (which is normal to the plane 128) is tilted away from the [0001] direction by a tilt angle β, with the tilt angle β being inclined (slightly) toward the [11$\bar{2}$0] direction.

Figure 5A:
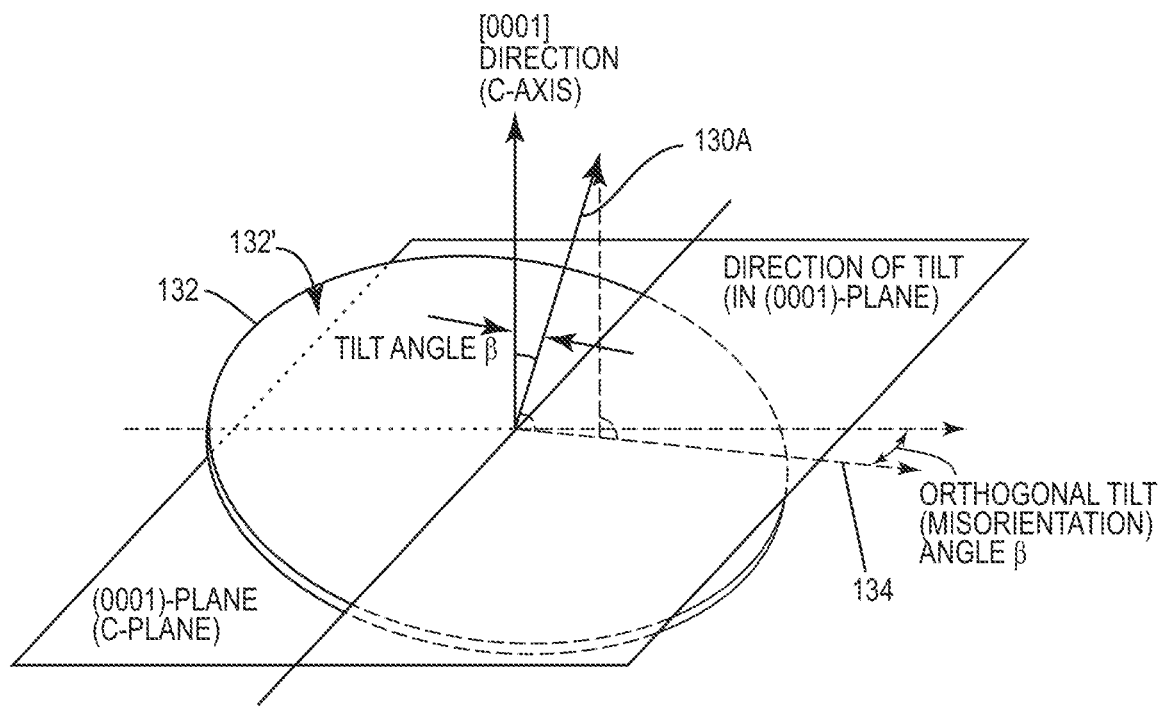
FIG. 5A is a perspective view wafer orientation diagram showing orientation of a vicinal wafer relative to the c-plane.
Figure 5B:
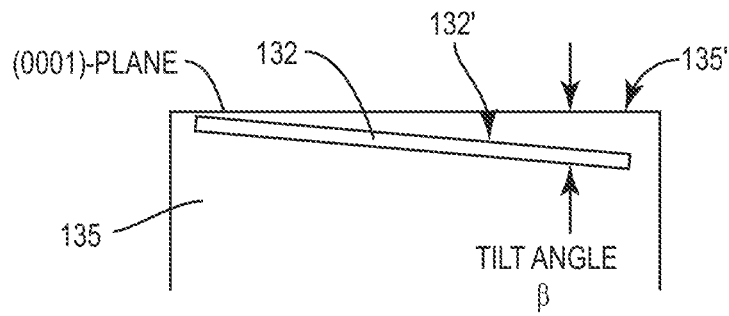
FIG. 5B is a simplified cross-sectional view of the vicinal wafer of FIG. 5A superimposed over a portion of an ingot.

FIG. 5A is a perspective view wafer orientation diagram showing orientation of a vicinal wafer 132 relative to the c-plane ((0001) plane), in which a vector 130A (which is normal to a wafer face 132') is tilted away from the [0001] direction by the tilt angle β. This tilt angle β is equal to an orthogonal tilt (or misorientation angle) p that spans between the (0001) plane and a projection 134 of the wafer face 132'. FIG. 5B is a simplified cross-sectional view of the vicinal wafer 132 superimposed over a portion of an ingot 135 (e.g., an on-axis ingot having an end face 135' parallel to the (0001) plane from which the vicinal wafer 132 may be defined. FIG. 5B shows that the wafer face 132' of the vicinal wafer 132 is misaligned relative to the (0001) plane by the tilt angle β.

Figure 6A:
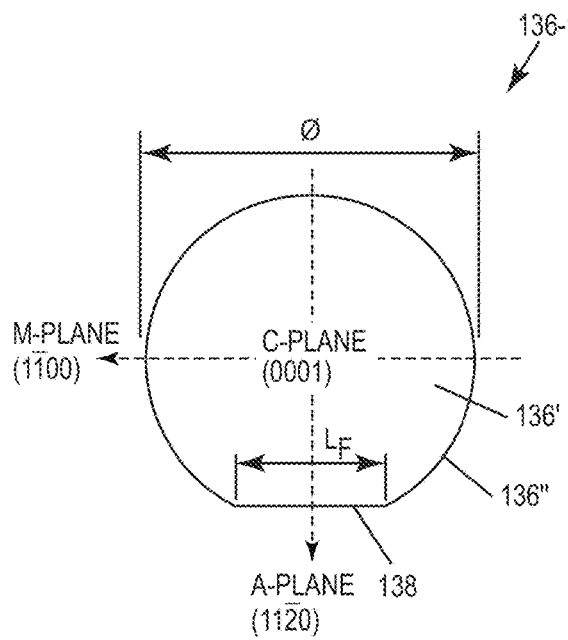
FIG. 6A and FIG. 6B are top plan views of exemplary SiC wafers, with superimposed arrows showing crystallographic planes.
Figure 6B:
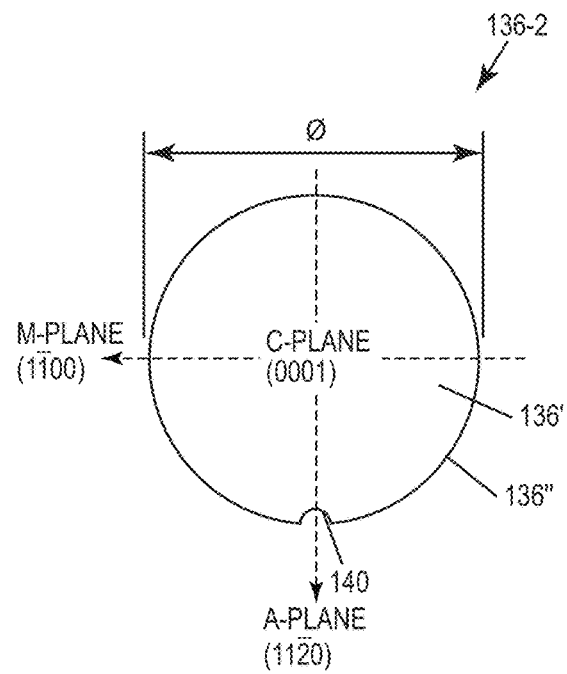

FIGS. 6A and 6B are top plan views of exemplary SiC wafers 136-1, 136-2 that include an upper face 136' (e.g., that is parallel to the (0001) plane (c-plane) and perpendicular to the [0001] direction) and laterally bounded by a generally round edge 136" (having a diameter Ø). In FIG. 6A, the round edge 136" of the SiC wafer 136-1 includes a primary flat 138 (having a length $L_F$) that is perpendicular to the (11$\bar{2}$0) plane, and parallel to the [11$\bar{2}$0] direction. In FIG. 6B, the round edge 136" of the SiC wafer 136-2 includes a notch 140 in place of the primary flat 138 illustrated in FIG. 6A. Depending on the particular application, the notch 140 may be provided for compatibility with various semiconductor manufacturing tools on which the SiC wafer 136-2 may be processed. As previously described, the SiC wafers 136-1, 136-2 may also be misaligned with (e.g., off-axis at an oblique angle relative to) the c-plane.

Another method for separating wafers or substrates from bulk crystalline material comprises a laser-assisted separation technique that includes forming laser subsurface damage within the bulk crystalline material and subsequently separating a wafer from the bulk crystalline material along the laser subsurface damage. Tools for forming subsurface damage in crystalline materials permit laser emissions to be focused within an interior of a crystalline material, and enable lateral movement of a laser relative to the crystalline material. Typical laser damage patterns may include formation of parallel lines that are laterally spaced relative to one another at a depth within the crystalline material. Parameters such as focusing depth, laser power, translation speed, and subsurface damage line spacing may be adjusted to impart laser damage, but adjustment of certain factors involves tradeoffs. Increasing laser power tends to impart greater subsurface damage that may enhance ease of fracturing (e.g., by reducing the stress required to complete fracturing), but greater subsurface damage increases surface irregularities along surfaces exposed by fracturing, such that additional processing may be required to render such surfaces sufficiently smooth for subsequent processing (e.g., for incorporation in electronic devices), and the additional processing leads to additional kerf losses. Reducing lateral spacing between subsurface laser damage lines may also enhance ease of fracturing, but a reduction in spacing between laser damage lines increases the number of translational passes between a substrate and a laser, thereby reducing tool throughput. Such laser-assisted separation techniques may provide reduced kerf losses as compared with wire sawing techniques. Kerf loss refers to a total amount of material loss associated with forming an individual wafer from bulk crystalline material.

Figure 7:
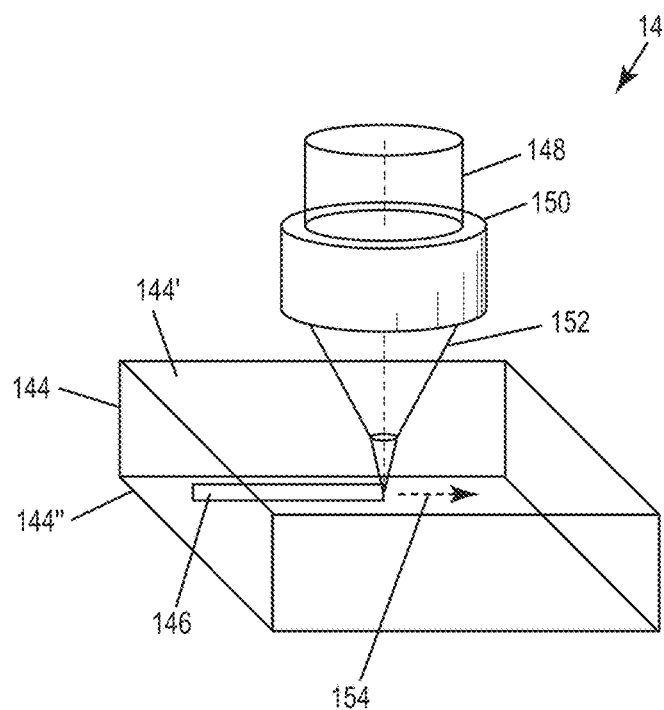
FIG. 7 is a perspective view schematic of an exemplary laser tool configured to focus laser emissions within an interior of a crystalline material for laser-assisted separation.

FIG. 7 is a perspective view schematic of one example of a laser tool 142 configured to focus laser emissions within an interior of a crystalline material 144 (e.g., SiC or the like) to form subsurface damage 146. The crystalline material 144 includes an upper surface 144' and an opposing lower surface 144'', and the subsurface damage 146 is formed in the interior of the crystalline material 144 between the upper and lower surfaces 144', 144''. Laser emissions 148 are focused with a lens assembly 150 to yield a focused beam 152, with a focal point thereof being in the interior of the crystalline material 144. Such laser emissions 148 may be pulsed at any suitable frequency (typically in the nanosecond, picosecond, or femtosecond range) and beam intensity, with a wavelength below the bandgap of the crystalline material 144 to permit the laser emissions 148 to be focused at a targeted depth below a surface thereof. At the focal point, the beam size and short pulse width results in an energy density high enough to result in very localized absorption that forms the subsurface damage 146. One or more properties of the lens assembly 150 may be altered to adjust a focal point of the focused beam 152 to a desired depth within the crystalline material 144. Relative lateral motion (e.g., lateral translation) between the lens assembly 150 and the crystalline material 144 may be effected to propagate the subsurface damage 146 in a desired direction 154, as schematically illustrated by a dashed line. Such lateral movement may be repeated in various patterns, including patterns as described hereinafter.

As used herein, a "substrate" or a "wafer" refers to a crystalline material, such as a single crystal semiconductor material. In certain embodiments, a substrate may have sufficient thickness (i) to be surface processed (e.g., lapped and polished) to support epitaxial deposition of one or more semiconductor material layers, and optionally (ii) to be free-standing if and when separated from a rigid carrier. In certain embodiments, a substrate may have a generally cylindrical or circular shape, and/or may have a thickness of at least about one or more of the following thicknesses: 200 microns (µm), 300 µm, 350 µm, 500 µm, 750 µm, 1 millimeter (mm), 2 mm, or more or less. In certain embodiments, a substrate may include a thicker wafer that is divisible into two thinner wafers. In certain embodiments, a substrate may be part of a thicker substrate or wafer having one or more epitaxial layers (optionally in conjunction with one or more metal contacts) arranged thereon as part of a device wafer with a plurality of electrically operative devices. The device wafer may be divided in accordance with aspects of the present disclosure to yield a thinner device wafer and a second thinner wafer on which one or more epitaxial layers (optionally in conjunction with one or more metal contacts) may be subsequently formed. In certain embodiments, large diameter wafers or substrates may comprise a diameter of 195 mm or greater, or 200 mm or greater, or 300 mm or greater, or 450 mm or greater, or in a range from 195 mm to 455 mm. In certain embodiments, a wafer or substrate may comprise 4H—SiC with a diameter of 195 mm or greater, or 200 mm or greater, and a thickness in a range of 100 µm to 1000 µm, or in a range of 100 µm to 800 µm, or in a range of 100 µm to 600 µm, or in a range of 150 µm to 500 µm, or in a range of 150 µm to 400 µm, or in a range of 200 µm to 500 µm, or in a range of 300 µm to 1000 µm, or in a range of 500 µm to 2000 µm, or in a range of 500 µm to 1500 µm, or in any other thickness range or having any other thickness value specified herein. In certain embodiments, the terms "substrate" and "wafer" may be used interchangeably as a wafer is typically used as a substrate for semiconductor devices that may be formed thereon. As such, a substrate or a wafer may refer to free-standing crystalline material that has been separated from a larger bulk crystalline material or substrate.

Embodiments disclosed herein may be applied to substrates or wafers of various crystalline materials, of both single crystal and polycrystalline varieties. In certain embodiments, substrates or wafers may comprise cubic, hexagonal, and other crystal structures, and may comprise crystalline materials having on-axis and off-axis crystallographic orientations. Exemplary embodiments may include single crystal semiconductor materials having hexagonal crystal structure, such as 4H—SiC, 6H—SiC. Various illustrative embodiments described hereinafter mention SiC generally or 4H—SiC specifically, but it is to be appreciated that other suitable crystalline materials may be used. Among the various SiC polytypes, the 4H—SiC polytype is particularly attractive for power electronic devices due to its high thermal conductivity, wide bandgap, and isotropic electron mobility. Embodiments disclosed herein may apply to on-axis SiC (i.e., with no intentional angular deviation from the c-plane thereof) or off-axis SiC (i.e., typically departing from a grown axis such as the c-axis by a non-zero angle, typically in a range of from 0.5 to 10 degrees or a subrange thereof such as 2 to 6 degrees or another subrange). Certain embodiments disclosed herein may utilize on-axis 4H—SiC or vicinal (off-axis) 4H—SiC having an offcut in a range from 1 to 10 degrees, or 2 to 6 degrees, or about 2, 4, 6, or 8 degrees. Embodiments disclosed herein may also apply to both doped crystalline semiconductor materials (e.g., N-doped conductive SiC and/or P-doped SiC), co-doped, and/or undoped crystalline semiconductor materials (e.g., semi-insulating SiC or high resistivity SiC). In certain embodiments, SiC crystalline materials, including SiC boules and SiC wafers, may comprise N-type doping (including intentional and unintentional dopants such as nitrogen) with concentrations in a range from $1 \times 10^{17}$ cm$^{-3}$ to $1 \times 10^{21}$ cm$^{-3}$, or in a range from $1 \times 10^{17}$ cm$^{-3}$ to $3 \times 10^{18}$ cm$^{-3}$, or in a range from $1 \times 10^{18}$ cm$^{-3}$ to $1 \times 10^{19}$ cm$^{-3}$, or in a range from $1 \times 10^{18}$ cm-3 to $3 \times 10^{18}$ cm$^{-3}$, or less than $1 \times 10^{17}$ cm$^{-3}$ among others. In certain embodiments, N-doped SiC crystalline materials may have a resistivity in a range from 0.001 ohm-cm to 0.05 ohm-cm, or in a range from 0.001 ohm-cm to 0.03 ohm-cm, or in a range from 0.005 ohm-cm to 0.05 ohm-cm, or in a range from 0.005 ohm-cm to 0.03 ohm-cm. In other embodiments, higher resistivity SiC crystalline materials, including semi-insulating SiC boules and semi-insulating SiC wafers, may comprise unintentionally doped or undoped SiC with a resistivity of at least 1500 ohm-cm, or at least 5000 ohm-cm, or at least 50,000 ohm-cm, or at least $1\times10^5$ ohm-cm, or at least $1\times10^6$ ohm-cm, or at least $1\times10^9$ ohm-cm or in a range from 1500 ohm-cm to $1\times10^9$ ohm-cm, or in a range from $1\times10^5$ ohm-cm to $1\times10^9$ ohm-cm. Semi-insulating SiC wafers may be doped with vanadium, aluminum, or combinations thereof. Co-doped SiC wafers may comprise combinations of two or more dopants, such as nitrogen, aluminum, and vanadium, among others depending on the embodiment.

Crystalline SiC can include various structural crystal defects, including micropipes, dislocations (e.g., threading, edge, screw and/or basal plane dislocations, among others), hexagonal voids, and stacking faults, among others. Structural crystal defects may be formed during crystal growth and/or during cooldown after growth where one or more discontinuities are formed in the material lattice structure of crystalline SiC. Such structural crystal defects can be detrimental to fabrication, proper operation, device yield, and reliability of semiconductor devices subsequently formed on SiC wafers. The presence of various structural crystal defects can provide stress in freestanding SiC wafers that may contribute to various deviations in wafer shape (e.g., reduced flatness characteristics as discussed below). Additional deviations to wafer shape may be formed during wafer separation from boules or ingots by either wire cutting or laser-assisted separation techniques as previously described.

Wafer flatness characteristics may be defined by one or more of warp, bow, total thickness variations (TTV), local thickness variation (LTV), site front least-squares range (SFQR), and wafer deflection values. "Warp" may be defined as the sum of the maximum positive and negative deviations from a focal plane of an unclamped wafer. Alternatively, warp may be defined as the difference between the maximum and minimum distances of the median surface of an unclamped wafer from a reference plane. "Bow" may be defined as the distance as measured at the center of an unclamped wafer between the surface of the wafer and the focal plane. Alternatively, bow may be defined as the deviation of the center point of the median surface of an unclamped wafer from a median surface reference plane defined by three points equally spaced along a circle with a diameter a specified amount less than the nominal diameter of the wafer. In certain embodiments related to SiC, bow may be measured from the Si-face of SiC wafers. "TTV" may be defined as the difference in thickness between the thickest and thinnest parts of the wafer. "LTV" may be defined as the difference in thickness between the thickest and thinnest parts of a particular area of the wafer. "SFQR" may be defined as the range of maximum and minimum deviation from a front reference plane calculated by a least square method for a particular site of the wafer. In certain embodiments, TTV, LTV, and SFQR may be measured from clamped wafers or wafers held under a vacuum chuck. "Deflection" may be defined as a spread between values for maximum and minimum deviations from a horizontal plane as measured across a wafer surface.

Various techniques may be used to measure wafer flatness characteristics according to embodiments disclosed herein. In certain embodiments, wafer flatness characteristics as provided herein are measured by a commercially available Tropel UltraSort automated wafer flatness analysis system manufactured by Corning Tropel Corporation of Fairport, NY. For such an analysis system, the focal plane of an unclamped wafer utilized to obtain warp and bow measurements may be defined by the surface height at three specific points on the wafer. The three specific points may be defined at locations that are 120 degrees apart from one another along the surface of the wafer and positioned at 97% of a radius of the wafer, minus a certain edge trim or exclusion region, as described in the Tropel UltraSort Operator's Manual, revision number J, February, 2007.

Figure 8A:
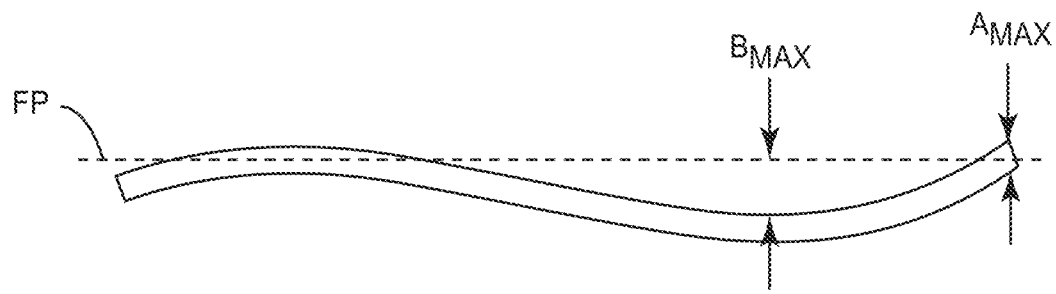
FIG. 8A is a side cross-sectional schematic view illustrating warp measurements of an unclamped wafer.
Figure 8B:
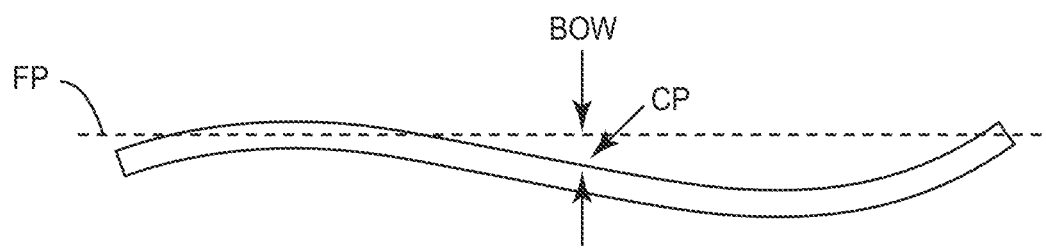
FIG. 8B is a side cross-sectional schematic view illustrating bow measurements of an unclamped wafer.
Figure 8C:
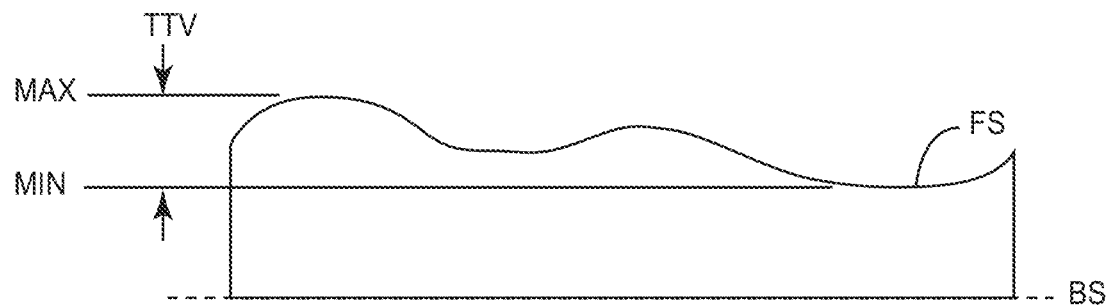
FIG. 8C is a side cross-sectional schematic view illustrating total thickness variation (TTV) measurements of a wafer.
Figure 8D:
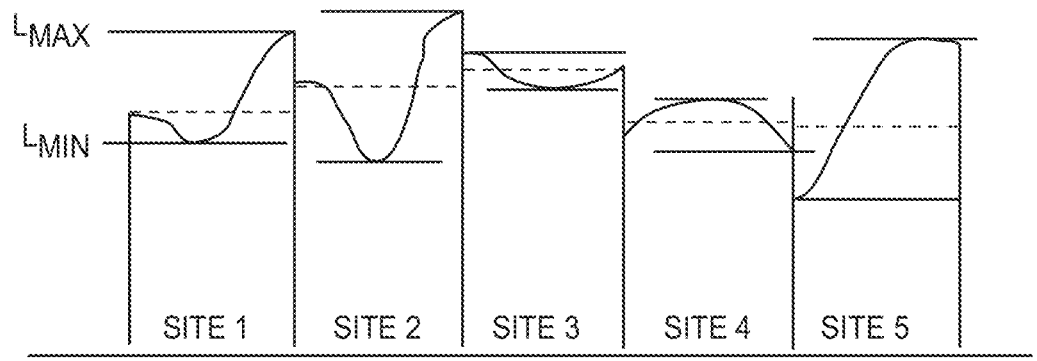
FIG. 8D is a side cross-sectional schematic view illustrating local thickness variation (LTV) measurements at various locations of a wafer.
Figure 8E:
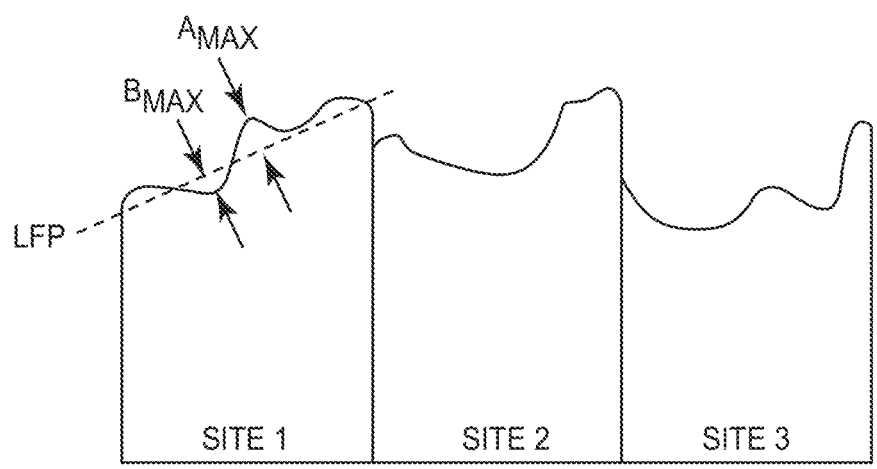
FIG. 8E is a side cross-sectional schematic view illustrating site front least-squares range (SFQR) measurements at various locations of a wafer.

FIGS. 8A-8E are provided to illustrate how wafer flatness characteristics have been quantified herein. In this regard, other measurement tools and equipment may be utilized to quantify wafer flatness characteristics in a similar manner. FIG. 8A is a side cross-sectional schematic view illustrating warp measurements of an unclamped wafer. The focal plane (FP) as described above is illustrated as a horizontal dashed line. $A_{MAX}$ represents a maximum distance from the FP to a surface of the wafer above the FP, and $B_{MAX}$ represents a maximum distance from the FP to a surface of the wafer below the FP. Warp may then be characterized as the sum of the absolute value of $A_{MAX}$ and $B_{MAX}$. FIG. 8B is a side cross-sectional schematic view illustrating bow measurements of an unclamped wafer. Bow may be characterized as the distance between the FP and the center point (CP) of the wafer surface. FIG. 8C is a side cross-sectional schematic view illustrating TTV measurements of a wafer. For the TTV measurement, the wafer is held in place by a vacuum chuck applied at a back surface (BS) of the wafer. TTV may be characterized as the difference between a maximum elevation (MAX) and a minimum elevation (MIN) of a front surface (FS) of the wafer relative to the BS. FIG. 8D is a side cross-sectional schematic view illustrating LTV measurements at various locations of a wafer. LTV may be characterized as a difference in local maximum elevation ($L_{MAX}$) and local minimum elevation ($L_{MIN}$) for a particular area of the wafer that is held in a clamped state or against a vacuum chuck. In FIG. 8D, five areas, or wafer sites (Site 1-Site 5), are illustrated and $L_{MAX}$ and $L_{MIN}$ are indicated with horizontal solid lines within each site. FIG. 8E is a side cross-sectional schematic view illustrating SFQR measurements at various locations of a wafer. The wafer may be held in a clamped state or against a vacuum chuck. For each site (Site 1-Site 3 in FIG. 8E), a localized focal plane ($L_{FP}$) is defined by a local least squares fit method as illustrated. $A_{MAX}$ represents a maximum distance from the LFP to a surface of the wafer above the LFP, and $B_{MAX}$ represents a maximum distance from the LFP to a surface of the wafer below the LFP. SFQR may then be characterized as the sum of the absolute value of $A_{MAX}$ and $B_{MAX}$ for each localized area or site of the wafer.

In certain embodiments, such measurement techniques may include interferometry. In certain embodiments, measurement techniques may include the use of an optical flat that is used to determine flatness, or lack thereof, of wafers. Warp, bow, and TTV may be referred to as global shape characteristics (i.e., a characteristic that affects an entire wafer, not just portions of the wafer surface) while LTV and SFQR may be referred to as local shape characteristics. Wafers with any of such global or local shape characteristics may be undesirable for several reasons. For example, during epitaxial growth processes, high warp, bow or TTV values can result in uneven contact between the wafer and a support susceptor which can cause thermal variations across the wafer, thereby resulting in non-uniform epitaxial layers and lower process yields for resulting devices formed thereon. Additionally, high values of warp, bow, or TTV may increase the risk of wafer cracking during certain device fabrication steps due to the stresses induced as the wafer is secured by vacuum chucks, wafer carriers, and the like. Wafers with varying LTV and SFQR values can cause localized variations in epitaxial growth, which can also lower process yields for devices formed thereon.

Wafer stress related to structural crystal defects formed during crystal growth or from wafer shape characteristics formed during wafer separation from boules or ingots can negatively impact wafer flatness, particularly for larger diameter SiC wafers (e.g., diameters greater than 150 mm). According to embodiments disclosed herein, SiC wafers with suitable wafer flatness values are disclosed that comprise a diameter of at least approximately 200 mm. With regard to relative dimensions, the term "approximately" is defined to mean a nominal dimension within a certain tolerance, such as plus or minus 5 mm from a diameter dimension. For example, as used herein, a wafer with a "200 mm" diameter may encompass a diameter range including 195 mm to 205 mm, a wafer with a "300 mm" diameter may encompass a diameter range including 295 mm to 305 mm, and a wafer with a "450 mm" diameter may encompass a diameter range including 445 mm to 455 mm. In further embodiments, such tolerances may be smaller, such as plus or minus 1 mm, or plus or minus 0.25 mm. In certain embodiments, SiC wafers with suitable wafer flatness values are disclosed that comprise a diameter in a range from approximately 200 mm to 450 mm, or in a range from approximately 200 mm to 300 mm, and a thickness in a range from 100 µm to 1000 µm, or in a range from 100 µm to 800 µm, or in a range from 200 µm to 600 µm, or in a range from 100 µm to 500 µm, or in a range from 200 µm to 500 µm, or in a range from 300 µm to 1000 µm, or in a range from 500 µm to 2000 µm, or in a range of 500 µm to 1500 µm. As such, in certain embodiments a SiC wafer comprises a diameter to thickness ratio of at least 250; or at least 350; or at least 400; or at least 500; or at least 600; or at least 1250; or in a range from 250 to 1250. In certain examples, a 200 mm diameter SiC wafer comprises a thickness of 800 µm (0.8 mm) for a diameter to thickness ratio of 250; or a thickness of 500 µm (0.5 mm) for a diameter to thickness ratio of 400; or a thickness of 350 µm (0.35 mm) for a diameter to thickness ratio of 571 (rounded). In other examples, a 300 mm diameter SiC wafer comprises a thickness of 800 µm (0.8 mm) for a diameter to thickness ratio of 375; or a thickness of 500 µm (0.5 mm) for a diameter to thickness ratio of 600; or a thickness of 350 µm (0.35 mm) for a diameter to thickness ratio of 857 (rounded). In still other examples, a 450 mm diameter SiC wafer comprises a thickness of 800 µm (0.8 mm) for a diameter to thickness ratio of 563 (rounded); or a thickness of 500 µm (0.5 mm) for a diameter to thickness ratio of 900; or a thickness of 350 µm (0.35 mm) for a diameter to thickness ratio of 1286 (rounded).

For SiC wafers with such diameter and thickness dimensions, mechanical rigidity may be difficult to maintain compared with smaller and thicker wafers. In this manner, deformation effects of stress and strain associated with forming large diameter SiC wafers are magnified. As described herein, SiC wafers and related methods are disclosed that provide large diameter SiC wafers with improved mechanical rigidity and wafer flatness characteristics. In certain embodiments disclosed herein, a SiC wafer with a diameter of at least approximately 200 mm and a thickness in a range from 300 µm to 1000 µm or in a range from 500 µm to 2000 µm comprises a bow in a range from −25 µm to 25 µm, or −10 µm to 10 µm, or −4 µm to 4 µm. According to further embodiments, a SiC wafer with a diameter of at least approximately 200 mm and a diameter to thickness ratio of at least 500, or at least 600, or at least 900 comprises a bow in a range from −25 µm to 25 µm, or −10 µm to 10 µm, or −4 µm to 4 µm. In certain embodiments as disclosed herein, a SiC wafer with such dimensions, including diameters of at least approximately 200 mm with the above-described thickness ranges and/or the diameter to thickness ratios, comprises a warp of less than 40 µm, or less than 16 µm, or less than 12 µm. In certain embodiments as disclosed herein, a SiC wafer with such dimensions comprises a TTV of less than 7 µm, or less than 2.6 µm, or less than 2.2 µm. In certain embodiments as disclosed herein, a SiC wafer with such dimensions comprises a LTV value or average for a site area of 1 cm$^2$ of less than 4 µm, or less than 1.3 µm, or less than 1 µm. In certain embodiments as disclosed herein, a SiC wafer with such dimensions comprises a SFQR maximum value for a site area of 1 cm$^2$ of less than 1.5 µm, or less than 0.6 µm, or less than 0.43 µm. The above-described bow, warp, TTV, LTV, and SFQR values are provided as measured by a Tropel UltraSort automated wafer flatness analysis system as described above. For the bow and warp measurements, the focal plane is defined by three points on an unclamped wafer where a first point is positioned at a top of the wafer that is 180 degrees from a primary flat and the other two points are provided in separate locations that are 120 degrees apart from the first point. Each of the three points are spaced from the wafer edge in a location that is 97% of a radius of the wafer, minus an edge trim or exclusion region distance of 2 mm. By way of example, the radius minus the edge trim value for a 200 mm wafer would be 98 mm. Accordingly, the three points would be positioned at a value that is 97% of 98 mm, or 95.06 mm.

Figure 9:
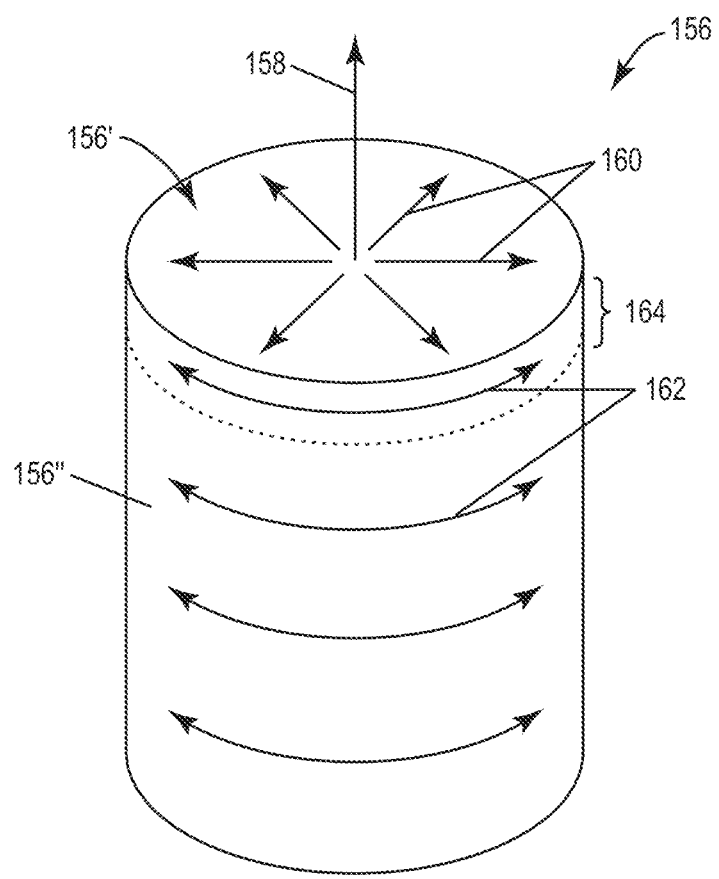
FIG. 9 is a perspective view of an exemplary SiC crystal boule with superimposed arrows indicating stress gradients and directions according to embodiments disclosed herein.

In certain embodiments disclosed herein, wafer shape and flatness characteristics for larger diameter SiC wafers are improved by reducing crystallographic stress, such as hoop stress, among others, in grown SiC crystal boules or ingots. FIG. 9 is a perspective view of an exemplary SiC crystal boule 156 according to embodiments disclosed herein. As illustrated, the SiC crystal boule 156 includes an end face 156', a side surface 156" along a periphery of the SiC crystal boule 156 that may form a generally cylindrical shape, and a central axis 158. Depending on the application, the end face 156' may correspond to the crystallographic c-plane and the central axis 158 may correspond with the [0001] direction. In other embodiments, the end face 156' may correspond to an off-axis plane relative to the crystallographic c-plane or the end face 156' may correspond to other crystallographic planes of SiC. During crystal growth and subsequent high temperature steps, stress may be present in the crystal primarily due to thermal gradients, but other factors such as differential doping and point defect concentrations can also play a role. If such stress exceeds a critical resolved shear stress for the material, then slip and climb mechanisms that introduce and move dislocations may be activated. The net result of these mechanisms may create a differing density of atom planes in differing regions of the crystal. This may be referred to as "missing" or "additional" planes of atoms. In a typical example of growth of a SiC crystal, "missing" planes of atoms may be more prevalent along peripheral portions of the SiC crystal boule 156 such that the "missing" atomic planes are positioned closer to the side surface 156" than the central axis 158. Post growth, the regions of the SiC crystal boule 156 containing the "missing" atomic planes may form low density SiC regions. In certain examples, such low density SiC regions can form annulus rings around the periphery of the SiC crystal boule 156. In this manner, a radial stress gradient 160 is formed in a direction from the central axis 158 toward the side surface 156", which in turn, may contribute to a hoop stress 162 or circumferential stress that is rotationally distributed relative to the central axis 158. In certain examples, stress due to the "missing" planes of atoms may also be referred to as "mirror stress". In FIG. 9, a curved dashed line is superimposed on the SiC crystal boule 156 to indicate the location of a SiC wafer 164 that may be separated from the SiC crystal boule 156. The hoop stress 162 is present in the SiC wafer 164 and can accordingly contribute to wafer shape deformations, such as one or more of increased bow, warp, TTV, LTV, and SFQR values for the SiC wafer 164. For large diameter crystal growth, such as growth for SiC wafers with diameters of at least approximately 200 mm, increased formation of extra or missing atomic planes and corresponding hoop stress 162 can contribute to even greater wafer shape deformations.

According to embodiments disclosed herein, the hoop stress 162 in large diameter crystal growth may be reduced to form large diameter SiC wafers having wafer shapes and flatness characteristics suitable for semiconductor manufacturing. In certain embodiments, the hoop stress 162 as well as other crystal stress may be reduced by altering one or more crystal growth conditions along one or more peripheral portions and central portions of the SiC crystal boule 156. Altered crystal growth conditions may be provided by modifying start of growth conditions (e.g., initial growth of SiC on the seed 104 of FIG. 1B), and/or providing altered growth conditions throughout growth of the crystal boule 156, and/or providing altered cooldown conditions after growth of the crystal boule 156. In this regard, a crystalline material of SiC may be grown at a growth temperature while maintaining stress for one or more portions of the crystalline material below a critical resolved shear stress for SiC at the growth temperature.

Growth conditions for SiC crystals may typically be carried out by a supply of Si- and C-containing gas species to the surface of a seed crystal and subsequent deposition of the Si and C constituents onto the seed surface. The ways to achieve this are many and the embodiments described herein are provided for altering certain aspects of SiC crystal growth to reduce growth-related crystal stress in large diameter SiC boules and resulting SiC wafers. The Si- and C-containing gas species may be provided by generating one or more of SiC, $SiC_2$, $Si_2C$ and Si gases through heating up solid source materials that may include one or more of polycrystalline SiC, single crystalline SiC, polymers of Si and C, a mixture of Si and C powders with a 1:1 ratio of Si to C or within a 20% tolerance of the 1:1 ratio, a mixture of SiC, Si and C powders where the Si to C ratio is 1:1 or within a 20% tolerance of the 1:1 ratio, pucks or lumps of amorphous or crystalline SiC (e.g., polycrystalline or single crystalline), and porous meshes of SiC. In certain embodiments, gaseous sources may also be used for a supply of Si- and C-containing gas species, separately or in addition to the solid source materials described above. Such gas sources may include one or more species such as $SiH_4$, $Si_2H_6$, $SiCl_2H_2$, $SiCl_3H$ $SiC_4$, $CH_4$, $C_2H_6$ and $Si(CH_3)_4$. In embodiments that include a combination of gaseous and solid sources, the ratio of Si:C in the solid source may be altered away from 1:1 as some of the Si or C supply is being provided by the gas.

In certain embodiments, these sources may predominantly include pure SiC, but impurities may often be added to achieve deliberate doping of the crystals, modification of the surface energies, deliberate generation of point defects and modification of the lattice size. These impurities can include almost any element in the period table, often Group Ill elements such as B to induce p-type doping, or N to induce n-type doping, larger atomic radii atoms including Ge and Sn, V, and some Lanthanides may be included to modify surface energies, and change the resultant crystal lattice parameter size, or introduce deep level electrical defects.

In certain embodiments, the source supply region may be kept at a higher temperature than the seed such that a temperature gradient is created from the source supply region towards the seed region of the crucible. This temperature gradient helps to provide the transport of the Si and C species to the seed. As the solid sources sublime and condense on the seed, the gaseous sources may also be driven by gas flow from the source region to the seed region. In certain embodiments, the gas sources may either be driven through a high temperature region to enable cracking of the gas into constituent parts for interaction with the seed surface, or the gas species can interact directly with the seed surface. In certain embodiments, one or more high frequency electric fields are used to aid the gas cracking process.

Both the source region and the seed region are generally contained in a crucible, and the source region may be positioned above, below, or adjacent to the seed region. In certain embodiments, the crucible may be made of a material that is relatively stable to Si- and C-containing gases. In certain embodiments, the crucible may include one or more of graphite, TaC and NbC coated graphite, and solid TaC and NbC, among others. In certain embodiments, crucibles may either be sealed to prevent gas escape, or partially open to allow some gas flow out of the crucible. In certain embodiments, crucibles may be electrically conductive to allow induction heating, while in other embodiments radiative heating may be used, and in still other embodiments, combinations of induction and radiative heating may be used. In certain embodiments, the temperature profiles in these crucibles may be controlled such that both the heat input to the system is considered and the use of insulation baffles used to control heat flow.

As the source region may generally be provided at a higher temperature than the seed region, a thermal gradient may be induced at the seed region. As such, the seed and subsequently growing SiC crystal may not be isothermal, but instead may contain thermal gradients. To prevent the generation of high stresses during the growth of the SiC crystal, crystal growth conditions may be controlled to reduce areas of the crystal that exceed the critical resolves shear stress of SiC during the growth process, or during the post growth cooldown to room temperature. By way of example, a crystalline material of SiC may be grown at a growth temperature while maintaining stress for one or more portions of the crystalline material below a critical resolved shear stress for SiC at the growth temperature. In certain embodiments, stress may be maintained below the critical resolved shear stress for at least twenty percent of the crystalline material from which a large diameter SiC wafer (e.g., diameter of approximately 200 mm) is formed. In further embodiments, stress may be maintained below the critical resolved shear stress for at least forty percent, or at least sixty percent, or at least eighty percent, or even one hundred percent of the crystalline material from which a SiC wafer is formed. In this regard, stress may be managed during growth to provide a large diameter SiC wafer having suitable wafer flatness characteristics, including one or more of bow, warp, TTV, LTV, and SFQR values as previously described. Mechanisms to provide low thermal stress in the growing and cooling of SiC crystal are many and a sufficiently low stress may be achieved by one or more combinations of the techniques outlined.

In certain embodiments, the use of insulation or insulating baffles above and below the crystal may be configured to reduce axial thermal gradients. In certain embodiments, insulating material or baffles may be provided around the sides of the seed zone to reduce axial gradients. In certain embodiments, selective heating of various regions of the crucible with one or more of direct inductive heating, illumination from a hotter region of the crucible or system, or heat conduction through a highly conductive material from a hotter region of the growth system may be configured to reduce axial gradients. In certain embodiments, heat profiles may also be altered by removing some heat by way of providing one or more highly conductive paths to draw heat to one or more cooler regions of the growth system. In certain embodiments, the crucible including the seed and source material may be arranged within insulation material and a top rod of thermally conducting material may be arranged to provide a path for heat to dissipate such that the seed region may be kept at a lower temperature than the source region. In certain embodiments, solid baffles or tubes situated below the seed region may be provided to allow directional control of the gas flux which may also act as a transfer mechanism for heat energy.

In certain embodiments, heating elements used to heat the crucible and/or the crucible lid may be adjusted to alter radial thermal gradients between the central axis 158 and the side surface 156" during one or more of the start of growth, throughout growth, and during cooldown for the SiC crystal boule 156. For hoop stress 162 improvements, particular radial thermal gradients may be unique between crystal growth growing apparatuses. Depending on the crystal growth process conditions for a particular growing apparatus as well as stress profiles of resulting crystals, altering the radial thermal gradients may comprise increasing or decreasing thermal gradients between the central axis 158 and the side surface 156". As such, radial growth profiles may be tailored to a particular growth process and apparatus in order to provide reduced or more uniform formation of extra atomic planes and corresponding BPDs for hoop stress 162 relief. In certain embodiments, thermal gradients may be altered by providing a graded thermal contact between the seed (104 of FIG. 1B) and the crucible lid (110 of FIG. 1B) or other seed holder for the side surface 156" of the resulting SiC crystal boule 156 compared with the central axis 158. In certain embodiments, growth conditions may be altered to intentionally provide crystal defects along peripheral portions of the SiC crystal boule 156 that may alter an elastic modulus profile of the crystal to counteract extra atomic planes that may form, thereby relieving the hoop stress 162. In other embodiments, growth conditions may be altered to intentionally provide crystal defects along central portions of the SiC crystal boule 156 to counteract or relieve the hoop stress 162. Such crystal defects may include defect clusters, crystal and/or hexagonal voids, stacking faults, different polytypes, micropipes, and additional dislocations (e.g., threading, edge, screw and/or basal plane dislocations), among others. In certain embodiments, the seed (104 of FIG. 1B) may be configured with increased defects along peripheral or central portions to promote increased defect formation in corresponding areas (peripheral or central) of the resulting SiC crystal boule 156. In certain embodiments, a mechanical stress may be intentionally formed between the seed (104 of FIG. 1B) and the crucible lid (110 of FIG. 1B) to intentionally alter a flatness of the seed (104 of FIG. 1B). As such, growth conditions along peripheral or central portions of the SiC crystal boule 156 may be adjusted based on relative variations in seed flatness.

Depending on relative configurations of the crystal growth equipment selected, individual ones and various combinations of the above-described altered crystal growth conditions may be provided to reduce stresses and/or provide large diameter SiC wafers with improved wafer shapes having suitable flatness characteristics for semiconductor manufacturing. In this regard, altered crystal growth conditions may comprise peripheral crystal growth conditions that are configured differently than central crystal growth conditions to promote reduction of crystallographic stress across large diameter boules. Such altered crystal growth conditions may be applicable to both doped crystalline SiC (e.g., N-doped conductive SiC) and unintentionally doped or undoped crystalline SiC (e.g., semi-insulating SiC or high resistivity SiC).

Figure 10A:
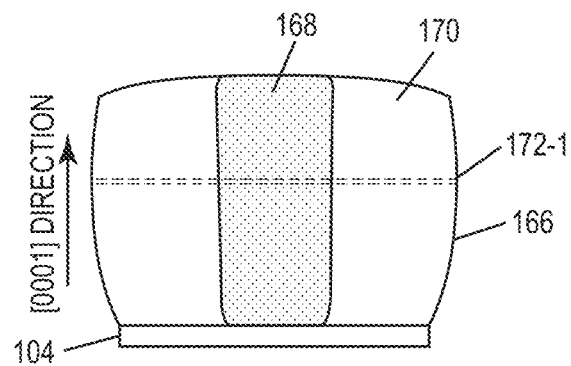
FIG. 10A is a side cross-sectional schematic view of SiC crystalline material on a seed crystal, showing a cylindrically shaped higher doping region extending upward from the seed crystal through a thickness of the SiC crystalline material along a central portion thereof.
Figure 10B:
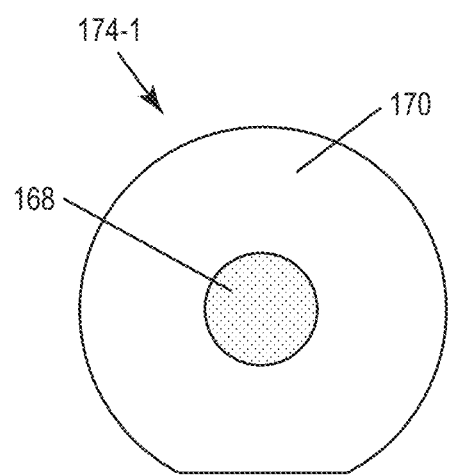
FIG. 10B is a top schematic view of a SiC wafer derived from the SiC crystalline material of FIG. 10A along a cross-sectional portion thereof.

For doped crystalline SiC, the presence of n-type dopants, such as nitrogen, can introduce additional crystal defects that may further contribute to crystal stress and reduced wafer flatness, particularly in large diameter SiC wafers. For high conductivity SiC wafers, nitrogen doping concentrations within SiC wafers are typically in a range from $1 \times 10^{18}$ $cm^{-3}$ to $4 \times 10^{21}$ $cm^{-3}$ with a variable radial doping profile due to faceted growth characteristics of SiC crystals. FIGS. 10A-18 illustrate various views of bulk SiC crystalline materials having variable doping profiles. FIG. 10A is a side cross-sectional schematic view of a SiC crystalline material 166 on a seed 104, showing a cylindrically shaped higher doping region 168 extending upward from the seed 104 through an entire thickness of the SiC crystalline material 166 along a central portion thereof. In certain embodiments, the higher doping region 168 is laterally bounded by a lower doping region 170 that is arranged along a perimeter of the SiC crystalline material 166. In certain embodiments, the lower doping region 170 may be intentionally doped, unintentionally doped, or undoped. Although FIG. 10A shows the size (e.g., width or diameter) of the higher doping region 168 as being substantially constant throughout the thickness of the SiC crystalline material 166, the size of higher doping region 168 can vary with vertical position within the SiC crystalline material 166 (e.g., typically being larger in width or diameter closer to the seed 104, and smaller with increasing distance away from the seed 104). Additionally, a magnitude of doping within the higher doping region 168 can vary with vertical position in the SiC crystalline material 166. A thin cross-sectional portion 172-1 of the SiC crystalline material 166 is indicated in dashed lines. FIG. 10B is a top schematic view of a SiC wafer 174-1 derived from the SiC crystalline material 166 of FIG. 10A along the cross-sectional portion 172-1. As illustrated, the higher doping region 168 forms a circular shape that is registered with a central region of the SiC wafer 174-1 and laterally bounded by the ring-shaped lower doping region 170 of the SiC wafer 174-1.

Figure 11:
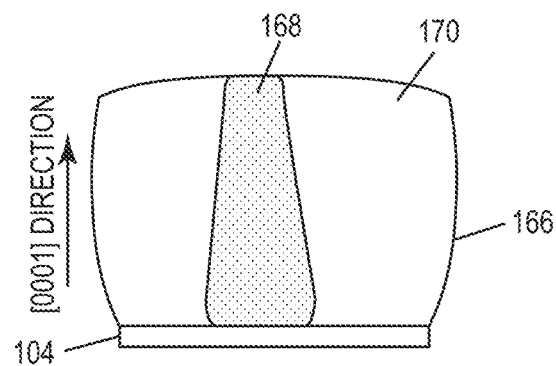
FIG. 11 is a side cross-sectional schematic view of SiC crystalline material on the seed crystal, showing a frusto-conically shaped higher doping region extending upward from the seed crystal through a thickness of the SiC crystalline material along a central portion thereof.
Figure 12:
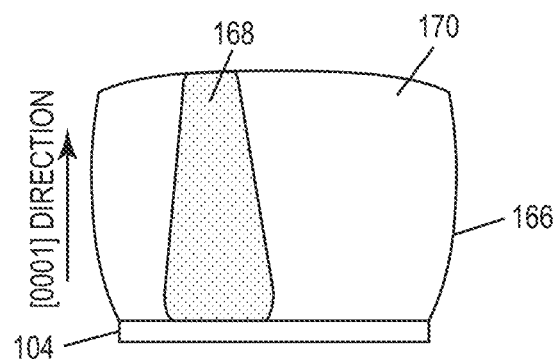
FIG. 12 is a side cross-sectional schematic view of SiC crystalline material on the seed crystal, showing a frusto-conically shaped higher doping region extending upward from the seed crystal at a non-centered position relative to a center of the seed crystal and upward through a thickness of the SiC crystalline material.

FIG. 11 is a side cross-sectional schematic view of the SiC crystalline material 166 on the seed 104 with a frustoconically shaped higher doping region 168 extending upward from the seed 104 through the entire thickness of the SiC crystalline material 166 along a central portion thereof. In certain embodiments, the lateral position and shape of the higher doping region 168 can differ relative to the configuration shown in FIG. 11 if a vicinal (e.g., offcut at an angle non-parallel to the c-plane) seed 104 is used for growth of the SiC crystalline material 166. For example, for vicinal crystal growth, the higher doping region 168 may be more oval than round in shape for a given cross-section, and/or may be offset laterally relative to a center of the SiC crystalline material 166. FIG. 12 is a side cross-sectional schematic view of the SiC crystalline material 166 on the seed 104, showing the higher doping region 168 extending upward from the seed 104 through the entire thickness of the SiC crystalline material 166 at a non-centered position relative to a center of the seed 104. In FIG. 12, the seed 104 may comprise a vicinal (e.g., offcut) seed crystal and the higher doping region 168 may form a generally oval shape that is offset from the center when viewed from above. In certain embodiments, the higher doping region 168 may form other shapes that are offset from center.

FIG. 13A is a side cross-sectional schematic view of the SiC crystalline material 166 on the seed 104 for embodiments where the higher doping region 168 may not initially form at the center of the seed 104. As such, a first lower doping region 170-1 may initially form at the center of the SiC crystalline material 166 that is laterally bounded by the higher doping region 168. After a period of growth, the higher doping region 168 may continuously form along the center such that the higher doping region 168 is laterally bounded by a second lower doping region 170-2. In this manner, the thin cross-sectional portion 172-1 of the SiC crystalline material 166 indicated in dashed lines may define the SiC wafer 174-1 as illustrated in FIG. 10B, while a lower thin cross-sectional portion 172-2 of the SiC crystalline material 166 may define a SiC wafer 174-2 that is illustrated in FIG. 13B. FIG. 13B is a top schematic view of the SiC wafer 174-2 derived from the SiC crystalline material 166 of FIG. 13A along the cross-sectional portion 172-2. As illustrated, the higher doping region 168 forms a circular shape that laterally bounds the lower doping region 170-1.

FIG. 14 is a side cross-sectional schematic view of the SiC crystalline material 166 on the seed 104 for embodiments where the higher doping region 168 may not initially form along one or more positions of the seed 104. As such, one or more first lower doping regions 170-1 may initially form that are registered with one or more various positions of the SiC crystalline material 166. In certain embodiments, the one or more first lower doping regions 170-1 are laterally bounded by the higher doping region 168. After a period of growth, the higher doping region 168 may continuously form along the center such that the higher doping region 168 is laterally bounded by the second lower doping region 170-2.

Figure 15:
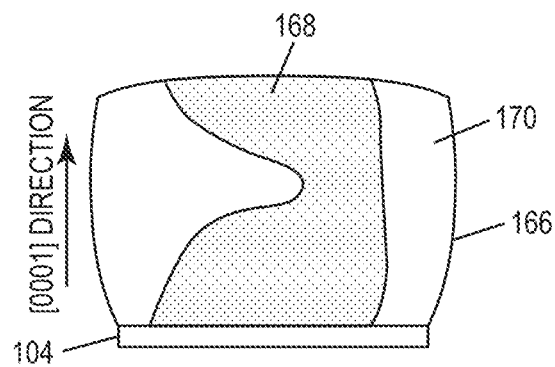
FIGS. 15-17 are side cross-sectional schematic views of SiC crystalline material on the seed crystal, showing a higher doping region that forms a non-symmetric shape through a thickness of the SiC crystalline material.
Figure 16:
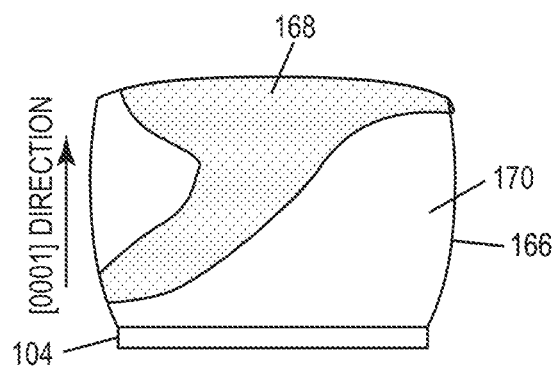
Figure 17:
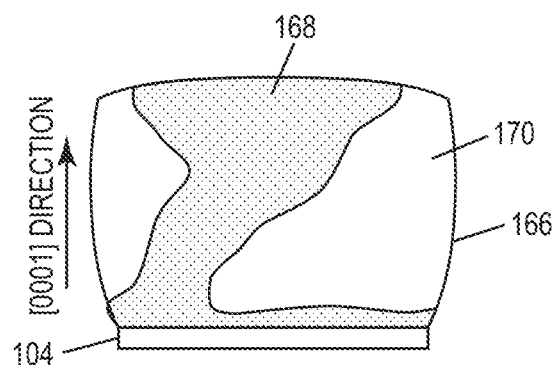

FIGS. 15-17 are side cross-sectional schematic views of the SiC crystalline material 166 on the seed 104 for embodiments where the higher doping region 168 may form a non-symmetric shape through a thickness of the SiC crystalline material 166. As illustrated in FIG. 15, growth conditions may initially form the higher doping region 168 with a wider area across the seed 104, followed by a narrower area, and back to a wider area towards an end of the SiC crystalline material 166. In FIG. 16, growth conditions may initially form the lower doping region 170 near the seed 104, followed by the higher doping region 168 with a non-symmetric shape that expands in radial area along a thickness of the SiC crystalline material 166. In FIG. 17, growth conditions may initially form the higher doping region 168 along a majority of the seed 104, followed by a non-symmetric shape of the higher doping region 168 that expands in radial area along a thickness of the SiC crystalline material 166.

Figure 18:
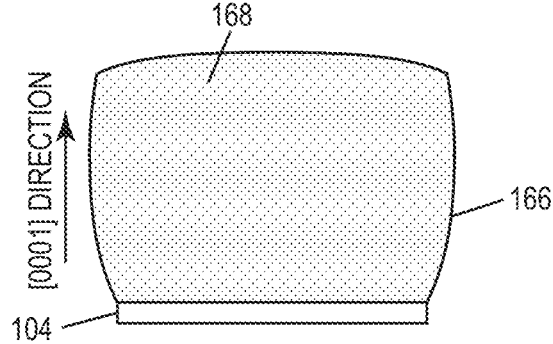
FIG. 18 is a side cross-sectional schematic view of SiC crystalline material on the seed crystal, showing a higher doping region that forms throughout the SiC crystalline material.

FIG. 18 is a side cross-sectional schematic view of the SiC crystalline material 166 on the seed 104 for embodiments where the higher doping region 168 is uniformly provided along a majority of the SiC crystalline material 166. In certain embodiments, growth conditions may form the higher doping region 168 across a substantial portion of the SiC crystalline material 166, or across the entire SiC crystalline material 166.

As is evidenced by the variable shapes of the higher doping regions 168 of FIGS. 10A-18, lateral dimensions of the higher doping region 168 and the lower doping regions 170, 170-1, 170-2 can vary depending on vertical and lateral position within the SiC crystalline material 166. In this manner, crystal stress related to doping may be variable across n-type SiC wafers formed from the same bulk SiC crystalline material, thereby contributing to undesirable deviations in wafer shape, particularly for n-type SiC wafers with diameters greater than at least approximately 200 mm. In certain embodiments, one or more combinations of a co-dopant or a strain compensating component may be added during crystal growth to counteract stress and/or strain related to crystal defects introduced by elevated concentrations of n-type dopants. Co-dopants and/or strain compensating components may include at least one of boron, aluminum, germanium, beryllium, gallium, tin, arsenic, phosphorus, titanium, vanadium and combinations thereof. In certain embodiments, due to faceted growth characteristics of SiC crystals, the co-dopants and strain compensating components may be incorporated with variable radial profiles that are similar to the variable radial profiles of the higher and lower doping regions 168, 170 of the n-type dopants. As such, flatness characteristics for large diameter n-type SiC wafers (e.g., at least approximately 200 mm) are disclosed with improved wafer shapes suitable for semiconductor manufacturing.

In certain embodiments, wafer shapes for large diameter SiC wafers may be improved after individual SiC wafers have been separated from corresponding SiC crystal boules. In this regard, a free-standing large diameter SiC wafer (e.g., at least approximately 200 mm) may have undesirable flatness values of one or more of warp, bow, TTV, LTV, and SFQR due to stress-related deformations associated with the crystal growth conditions and/or the subsequent wafer separation process. As such, various approaches are disclosed for relieving crystal stress and improving wafer shapes of free-standing SiC wafers, including annealing SiC wafers under mechanical load or stress, selectively implanting surfaces of SiC wafers, and selectively depositing films on surfaces of SiC wafers.

Figure 19A:
FIGS. 19A-19C are schematic cross-sectional views of a SiC wafer at various states of a fabrication process for annealing the SiC wafer under mechanical stress for an improved wafer shape.
Figure 19B:
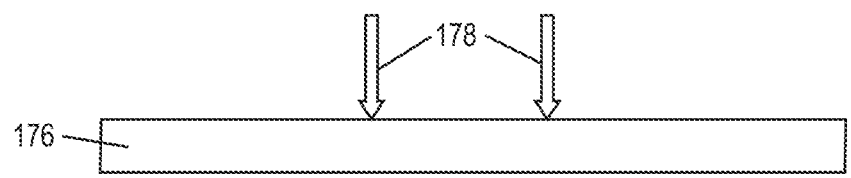
Figure 19C:
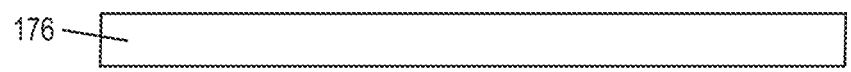

FIGS. 19A-19C are schematic cross-sectional views of a SiC wafer 176 at various states of a fabrication process for annealing the SiC wafer 176 under mechanical stress. In FIG. 19A, the SiC wafer 176 is free-standing after separation from a crystal boule (not shown) and exhibits a deformed wafer shape. For illustrative purposes, the SiC wafer 176 is illustrated with a wavy curved shape; however, any number of wafer shapes may exist that provide undesirable flatness values. As previously described, the deformed wafer shape may be formed by stress-related deformations associated with one or more of various crystal growth conditions and the subsequent wafer separation processes. In FIG. 19B, a mechanical load 178 or stress is applied to the SiC wafer 176 in order to alter the deformed wafer shape illustrated in FIG. 19A. The mechanical load 178 may comprise a weight or other force applied to one or more portions of the SiC wafer 176 that is sufficient to at least temporarily hold the SiC wafer 176 with a flatter wafer shape. In this regard, the mechanical load 178 may provide stress to the SiC wafer 176 that is counter to crystal stress from crystal growth conditions and/or the wafer separation process. While under the mechanical load 178, the SiC wafer 176 may then be subjected to an annealing process where the SiC wafer 176 is heated and subsequently cooled such that the SiC wafer 176 maintains a flatter wafer shape after annealing as illustrated in FIG. 19C. In certain embodiments, annealing may be performed at temperatures at or above 1000° C., or in a range from 1000° C. to 2000° C. In other embodiments, the SiC wafer 176 may be annealed without being subjected to a mechanical load 178 to improve wafer shape characteristics. As disclosed herein, the SiC wafer 176 may form a first wafer shape as illustrated in FIG. 19A, and annealing the SiC wafer 176 under the mechanical load 178 may form a second wafer shape as illustrated in FIG. 19C. In certain embodiments, the second wafer shape may comprise improved flatness values of one or more of warp, bow, TTV, LTV, and SFQR. In this manner, a stress profile and corresponding defect profile of the SiC wafer 176 may be altered by annealing the SiC wafer 176 under the mechanical load 178. For example, dislocations may be formed or moved to certain locations of the SiC wafer 176 to counter existing structural defects in other locations of the SiC wafer 176, or dislocations may be added or moved to the same locations as existing structural defects. In certain embodiments, the mechanical load 178 may be applied in a uniform manner across certain portions of the SiC wafer 176 or in a uniform manner across the entirety of the SiC wafer 176. In other embodiments, the mechanical load 178 may be applied in a non-uniform manner across the SiC wafer 176 depending on the type of wafer shape deformation. For example, the mechanical load 178 may be applied to one or more localized portions of the SiC wafer 176, such as the center of the SiC wafer 176, or along peripheral portions of the SiC wafer 176, or both. In various downstream semiconductor manufacturing processes, such as epitaxial growth and other device fabrication steps, the SiC wafer 176 may be supported by either continuous flat surfaces or with edge-supported configurations. Depending on the particular downstream application, the SiC wafer 176 may accordingly be supported by either a continuous flat surface or by an edge-supported configuration (e.g., three-point support, ring-shaped support, and the like) during application of the mechanical load 178. In this manner, the SiC wafer 176 may be provided with a wafer shape that is tailored for a particular downstream application. In other embodiments, the SiC wafer 176 may be annealed without being subjected to a mechanical load 178 to alter a stress profile and corresponding defect profile to provide improved wafer shape characteristics.

Figure 19D:
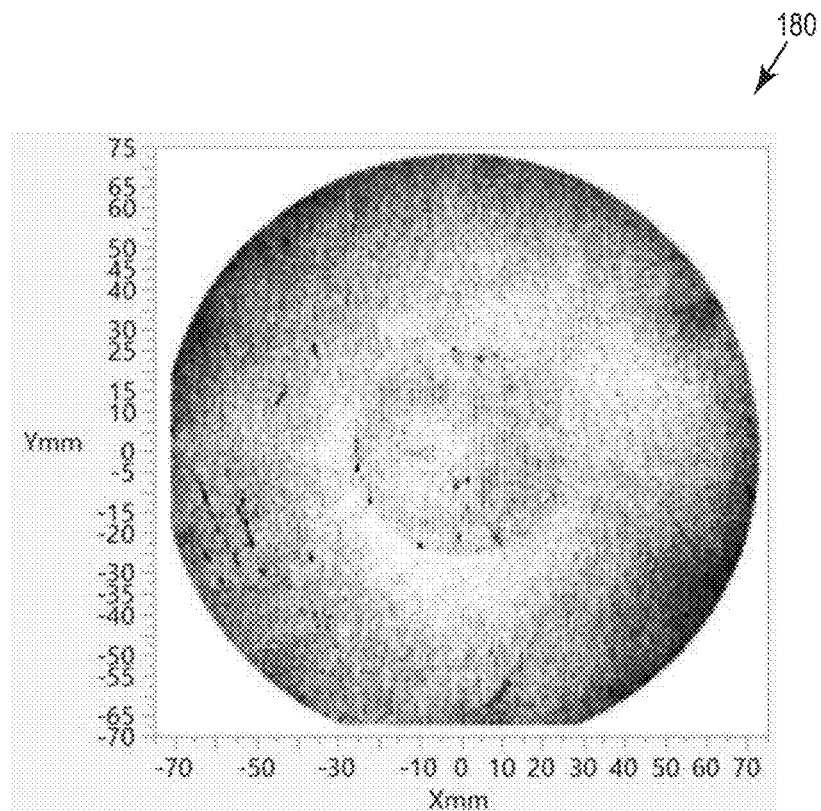
FIG. 19D is a top view image illustrating a dislocation profile map for a SiC wafer after annealing under mechanical stress according to FIGS. 19A-19C.
Figure 19E:
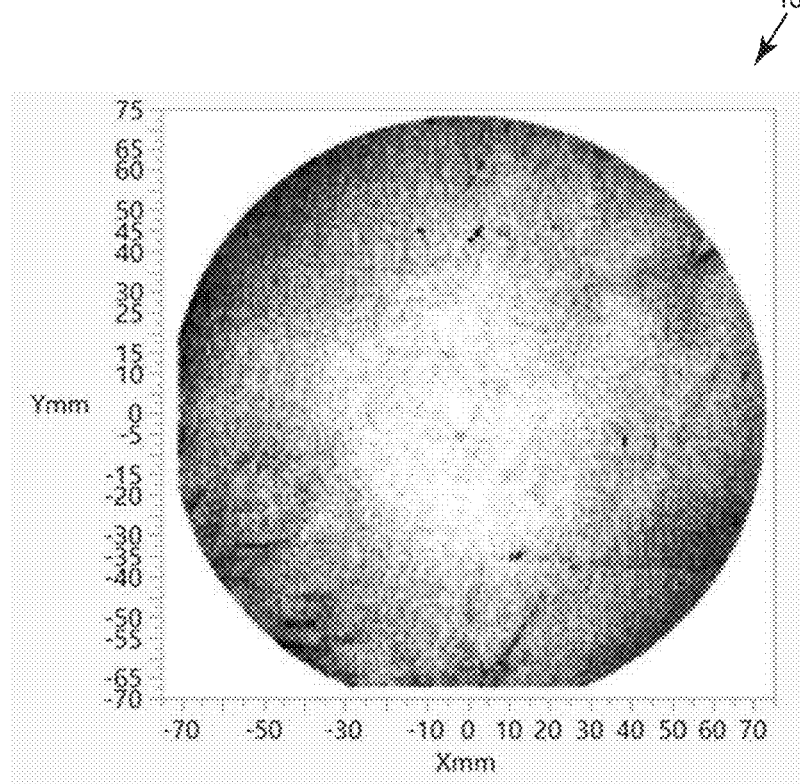
FIG. 19E is a top view image illustrating a dislocation profile map for a comparison SiC wafer that has not been subjected to annealing under mechanical stress according to FIGS. 19A-19C.

FIGS. 19D and 19E are top view images of SiC wafers illustrating dislocation profile maps for SiC wafers according to embodiments disclosed herein. FIG. 19D is a top view image of a SiC wafer 180 after annealing under mechanical stress according to FIGS. 19A-19C. By way of example, the mechanical load (178 of FIG. 19B) was applied to the SiC wafer 180 as a disc-shaped force along a center of the SiC wafer 180 during annealing at about 1500° C. In the image, darker regions correspond to areas of the SiC wafer 180 with higher dislocations while lighter regions correspond to areas with lower dislocations. As illustrated, darker regions with increased dislocations tend to be arranged closer to perimeter edges of the SiC wafer 180 as compared with central regions of the SiC wafer 180. As previously described, such variation in dislocation densities can lead to a stress profile that decreases flatness characteristics for large diameter wafers. After annealing with a disc-shaped mechanical load applied to the center of the SiC wafer 180, a corresponding increase in dislocations is visible as a darker circular region between values of about −30 mm and 30 mm along the x and y axis of the image. For reference purposes, FIG. 19E is a top view image of a SiC wafer 182 that has not been subjected to annealing under mechanical stress. For comparison, the SiC wafer 182 is a wafer that was formed from a nearby slice of the same crystal boule as the SiC wafer 180 of FIG. 19D. In this manner, the SiC wafer 182 represents a same or similar dislocation profile as the SiC wafer 180 before annealing. As illustrated, the central portion of the SiC wafer 182 includes a generally lower dislocation profile than perimeter portions. In this regard, annealing SiC wafers under mechanical load may provide altered dislocation or other structural defect profiles that can be tailored to counteract or balance stress in SiC wafers, thereby improving flatness. While a disc-shaped mechanical load was demonstrated in FIG. 19D, the mechanical load may be provided in different shapes and in different locations of SiC wafers to assist with various stress-related shape deformations that may be present. In order to identify dislocations, the SiC wafers 180, 182 were subjected to a surface etching process (e.g., potassium hydroxide (KOH)) in order to reveal etch pits that correspond with dislocation positions. Additionally, the SiC wafers 180, 182 of FIGS. 19D and 19E were selected with 150 mm diameters; however, annealing under mechanical load may be applied to wafers of any diameter, including diameters less than 150 mm and in a range from approximately 200 mm to 450 mm.

Figure 20A:
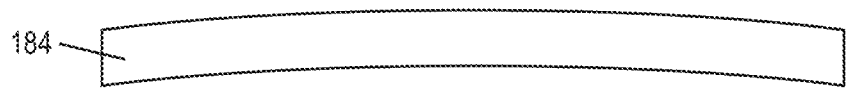
FIGS. 20A-20C are schematic cross-sectional views of a SiC wafer at various states of a fabrication process for selectively implanting the SiC wafer for an improved wafer shape.
Figure 20B:
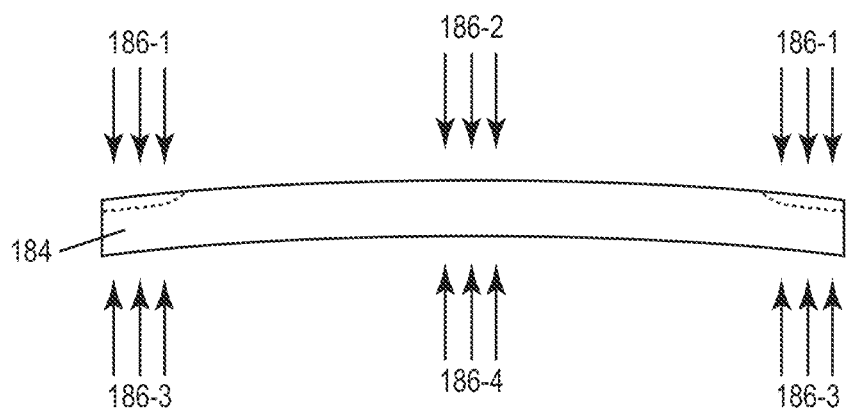
Figure 20C:

FIGS. 20A-20C are schematic cross-sectional views of a SiC wafer 184 at various states of a fabrication process for selectively implanting the SiC wafer 184. In FIG. 20A, the SiC wafer 184 is free-standing after separation from a crystal boule (not shown) and exhibits a deformed wafer shape. For illustrative purposes, the SiC wafer 184 is illustrated with a curved or convex shape; however, any number of wafer shapes may exist that provide undesirable flatness values. As previously described, the deformed wafer shape may be formed by stress-related deformations associated with one or more of various crystal growth conditions and the subsequent wafer separation processes. In FIG. 20B, selective ion implantation is applied to one or more of perimeter portions (e.g., 186-1, 186-3) and center portions (e.g., 186-2, 186-4) of frontside or backside surfaces of the SiC wafer 184 to offset certain stress-related deformations. Ion implantation is a flexible and convenient method for selectively doping portions of a crystal lattice of the SiC wafer 184. In an ion implantation process, dopant ions are accelerated to a high energy, usually expressed in keV or MeV, and directed towards a frontside (or carbon face) of the SiC wafer 184. In other embodiments, ion implantation may be applied to a backside (or silicon face) of the SiC wafer 184. The implants penetrate the surface of the SiC wafer 184 and come to rest somewhere within the crystal structure or lattice of the SiC wafer 184. The number of ions implanted, referred to as the dose, is usually expressed in terms of ions per square centimeter. Implanting of ions can alter stress and strain by one or more of localized expanding, contracting, heating, and/or displacing of the crystal structure within the SiC wafer 184. As such, ions may be selectively implanted in certain areas of the SiC wafer 184 to offset stress-related deformation. Accordingly, implanted ions may provide a mechanical load to one or more areas of the SiC wafer 184. The selective ion implantation may be performed by masking other portions of the SiC wafer 184 to prevent ions from penetrating the masked portions. In certain embodiments, multiple doping processes may be performed to create stacked doping areas of the SiC wafer 184. In ion implantation, dopant atoms may include, but are not limited to, nitrogen, phosphorus, aluminum, germanium and/or boron. Ion implantation may include implanting electrically active materials or inactive materials such as helium, neon, argon, krypton, and/or radon. In certain embodiments, the selective ion implantation is performed in the perimeter portions 186-1, 186-3 of the SiC wafer 184 where subsequent semiconductor devices will not be formed, such as no more than approximately 5 mm from a peripheral edge of the SiC wafer 184. As illustrated in FIG. 20C, one or more combinations of selective ion implantation to any of the portions 186-1 to 186-4 may be provided to offset the stress-related deformation of the SiC wafer 184 shown in FIG. 20A, thereby improving wafer flatness. Exemplary (but not limiting) techniques and structures for improving wafer shape by ion implantation is set forth in the commonly assigned U.S. patent application Ser. No. 16/269,837, which is hereby incorporated by reference herein. In other embodiments, subsurface damage may be applied to any of the portions 186-1 to 186-4 of the SiC wafer 184 to offset stress-related deformation. Subsurface damage may be formed by applying a mechanical force with one or more combinations of diamond particles, SiC particles, or powder to the SiC wafer 184. In certain embodiments, the subsurface damage may be applied after one or more surfaces of the SiC wafer 184 have been polished. In certain embodiments, the SiC wafer 184 may be annealed as described above after selective ion implantation to maintain improved wafer shape characteristics.

Figure 21A:
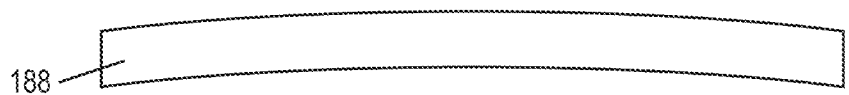
FIGS. 21A-21C are schematic cross-sectional views of a SiC wafer at various states of a fabrication process for selectively depositing films on the SiC wafer for an improved wafer shape.
Figure 21B:
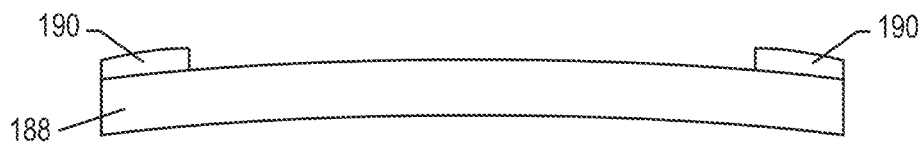
Figure 21C:
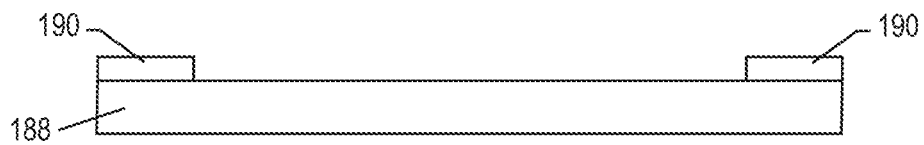

FIGS. 21A-21C are schematic cross-sectional views of a SiC wafer 188 at various states of a fabrication process for selectively depositing films on the SiC wafer 188. In FIG. 21A, the SiC wafer 188 is free-standing after separation from a crystal boule (not shown) and exhibits a deformed wafer shape. For illustrative purposes, the SiC wafer 188 is illustrated with a curved or convex shape; however, any number of wafer shapes may exist that provide undesirable flatness values. As previously described, the deformed wafer shape may be formed by stress-related deformations associated with one or more of various crystal growth conditions and the subsequent wafer separation processes. In FIG. 21B, a film 190 is selectively deposited along perimeter portions of a surface of the SiC wafer 188 to offset certain stress-related deformations. Materials and/or thicknesses of the film 190 may be chosen to provide a coefficient of thermal expansion (CTE) mismatch with the SiC wafer 188 that is configured to provide stress that offsets other stress and strains of the SiC wafer 188. In this manner, the film 190 may provide a mechanical load to one or more areas of the SiC wafer 188. In certain embodiments, the film 190 may include one or more of SiC, SiN, or various other oxides. In certain embodiments, the selective deposition of the film 190 may be performed in areas of the SiC wafer 188 where subsequent semiconductor devices will not be formed, such as no more than approximately 5 mm from a peripheral edge of the SiC wafer 188. As illustrated in FIG. 21C, the selective deposition of the film 190 may be provided to offset the stress-related deformation of the SiC wafer 188 that are shown in FIG. 21A, thereby improving wafer flatness. In certain embodiments, the SiC wafer 188 may be annealed as described above after deposition of the film 190 to maintain improved wafer shape characteristics. In this regard, the film 190 may either remain on the wafer 188 or it may be removed and the wafer may maintain improved wafer shape characteristics.

Figure 22A:
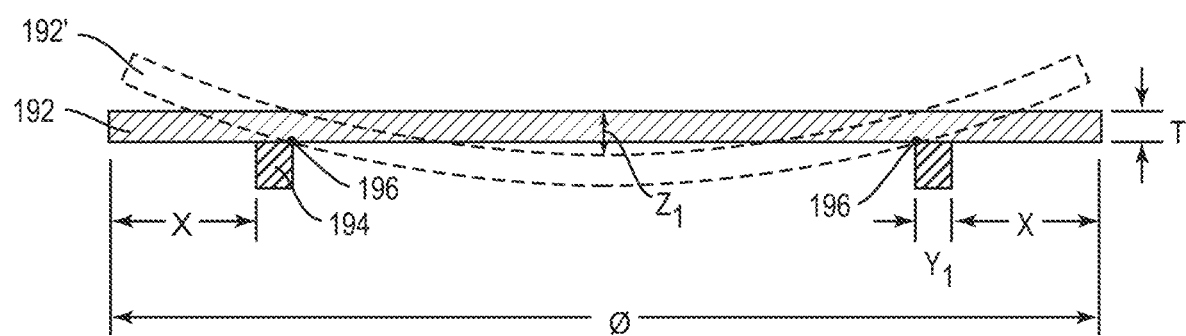
FIG. 22A is a side cross-sectional schematic view of a SiC wafer in an edge-supported configuration for deflection characterization according to embodiments disclosed herein.

FIG. 22A is a side cross-sectional schematic view of a SiC wafer in an edge-supported configuration for deflection characterization according to embodiments disclosed herein. As previously described, SiC wafers may be arranged in edge-supported configurations during various device fabrication steps. For large area SiC wafers with certain thicknesses, deflection values may include contributions from one or more of crystal stress, crystal strain, and gravity of wafers in edge-supported configurations. In FIG. 22A, a SiC wafer 192 having a diameter Ø and a thickness T is arranged on edge supports 194. In certain embodiments, the edge supports 194 comprise a three point support for the SiC wafer 192. In other embodiments, the edge supports 194 may comprise a continuous ring or a series of discontinuous ring segments. In such arrangements, the SiC wafer 192 may contact the continuous ring or the series of discontinuous ring segments from at least three contact points. As illustrated, the edge supports 194 are spaced from a peripheral edge of the SiC wafer 192 by a distance X, and the edge supports 194 form a thickness $Y_1$ in a same direction as the diameter Ø of the SiC wafer 192. For a SiC wafer 192 having a certain diameter Ø and thickness T, the influence of one or more of crystal stress, crystal strain, and gravity can cause deformation that forms a SiC wafer 192' with a different shape and an edge-supported deviation $Z_1$. The $Z_1$ values may be obtained across the top surface of the SiC wafer 192'. The SiC wafer 192' may contact each of the edge supports 194 by a single contact point 196. As such, the single contact point 196 for each of the edge supports 194 may comprise a distance that is a sum of the distance X and the thickness $Y_1$. In certain embodiments, the distance X may be about 30% of the diameter Ø, although other distances may be used as long as the distance X is common between groups of measurements for comparison purposes.

Edge-supported deviation values $Z_1$ across the SiC wafer 192' as measured from top surfaces of the SiC wafer 192' to top surfaces of the un-deformed SiC wafer 192 may be measured by various techniques, including interferometry with an optical flat, a drop gauge, and the like. The top surfaces of the un-deformed SiC wafer 192 may be provided by a three-point focal plane as previously described. After edge-supported deviation values $Z_1$ are determined across the SiC wafer 192', edge-supported deflection values may be defined as the spread between maximum and minimum edge-supported deviation values $Z_1$.

Figure 22B:
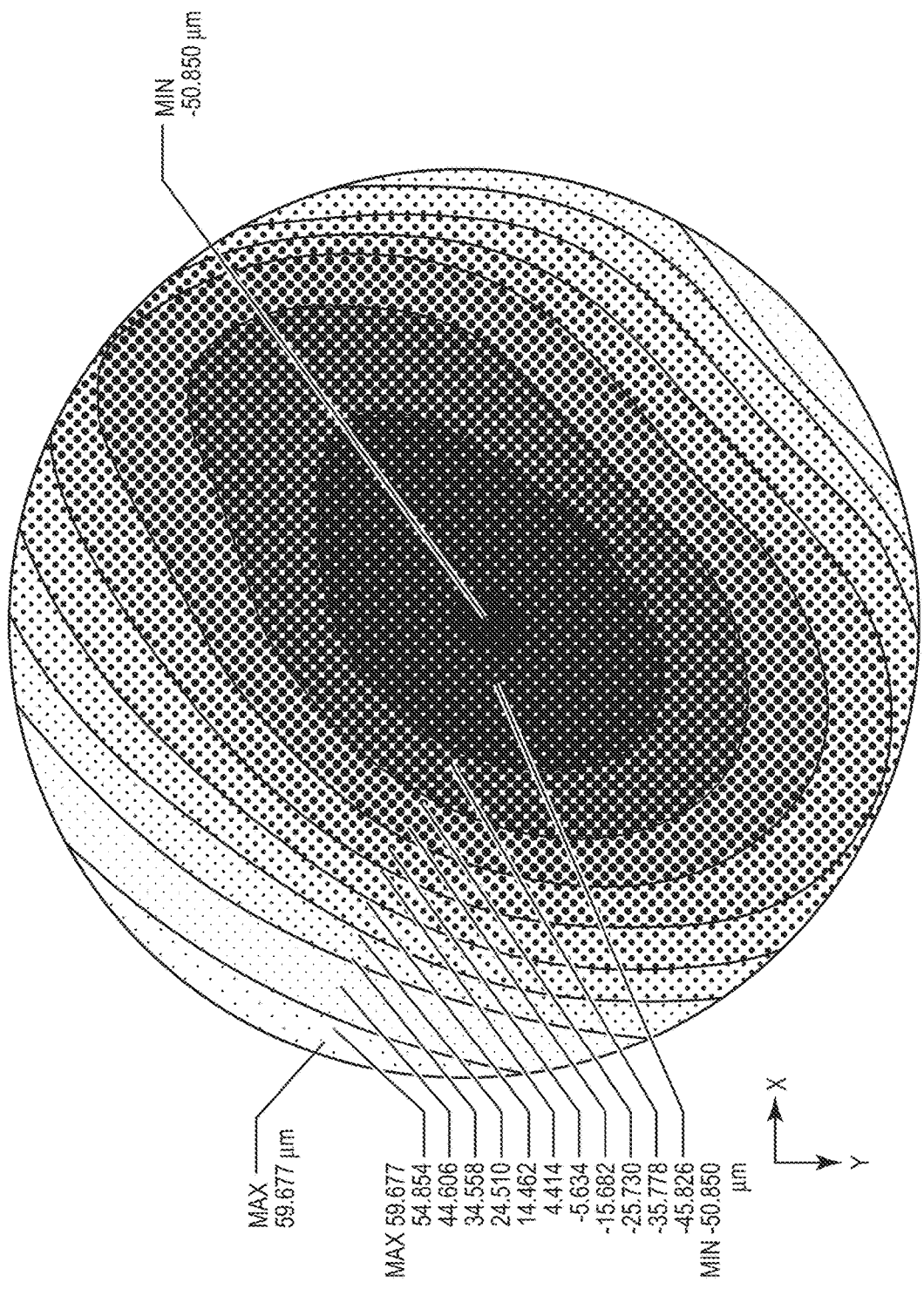
FIG. 22B is a contour plot illustrating edge-supported deviation values as measured for a SiC wafer that are used to determine deflection values according to embodiments disclosed herein.

FIG. 22B is a contour plot illustrating edge-supported deviation values as measured for a SiC wafer that are used to determine deflection values according to embodiments disclosed herein. For the purposes of the measurement, the SiC wafer was selected with a diameter of 200 mm and a thickness of 500 µm. The SiC wafer was arranged in an edge-supported configuration in a Tropel UltraSort automated wafer flatness analysis system where a sum of the distance X and the thickness $Y_1$ (FIG. 22A) was set at a value of 2 mm from the wafer edge. In FIG. 22B, various contour lines are illustrated to show how measured deviation values differ across the SiC wafer. Additionally, specific deviation values are indicated at different points across the wafer to show how deviation values change within and across the contour lines. As illustrated, a minimum deviation value (Min) of −50.850 µm is indicated near a center of the SiC wafer and a maximum deviation value (Max) of 59.677 µm is indicated near a perimeter of the SiC wafer. As such, a maximum edge-supported deflection value for the SiC wafer of FIG. 22B may be defined as the spread between the Max and Min absolute values, or 110.527 µm. In certain embodiments, SiC wafers as disclosed herein with a diameter of at least approximately 200 mm and a thickness in a range from 475 µm to 525 µm demonstrated maximum edge-supported deflection values of less than or equal to 150 µm, or less than or equal to 120 µm, or less than or equal to 110 µm, or in a range from 110 µm to 150 µm. In certain embodiments, the SiC wafers with such deflection values may comprise a diameter in a range from approximately 200 mm to 300 mm.

Figure 22C:
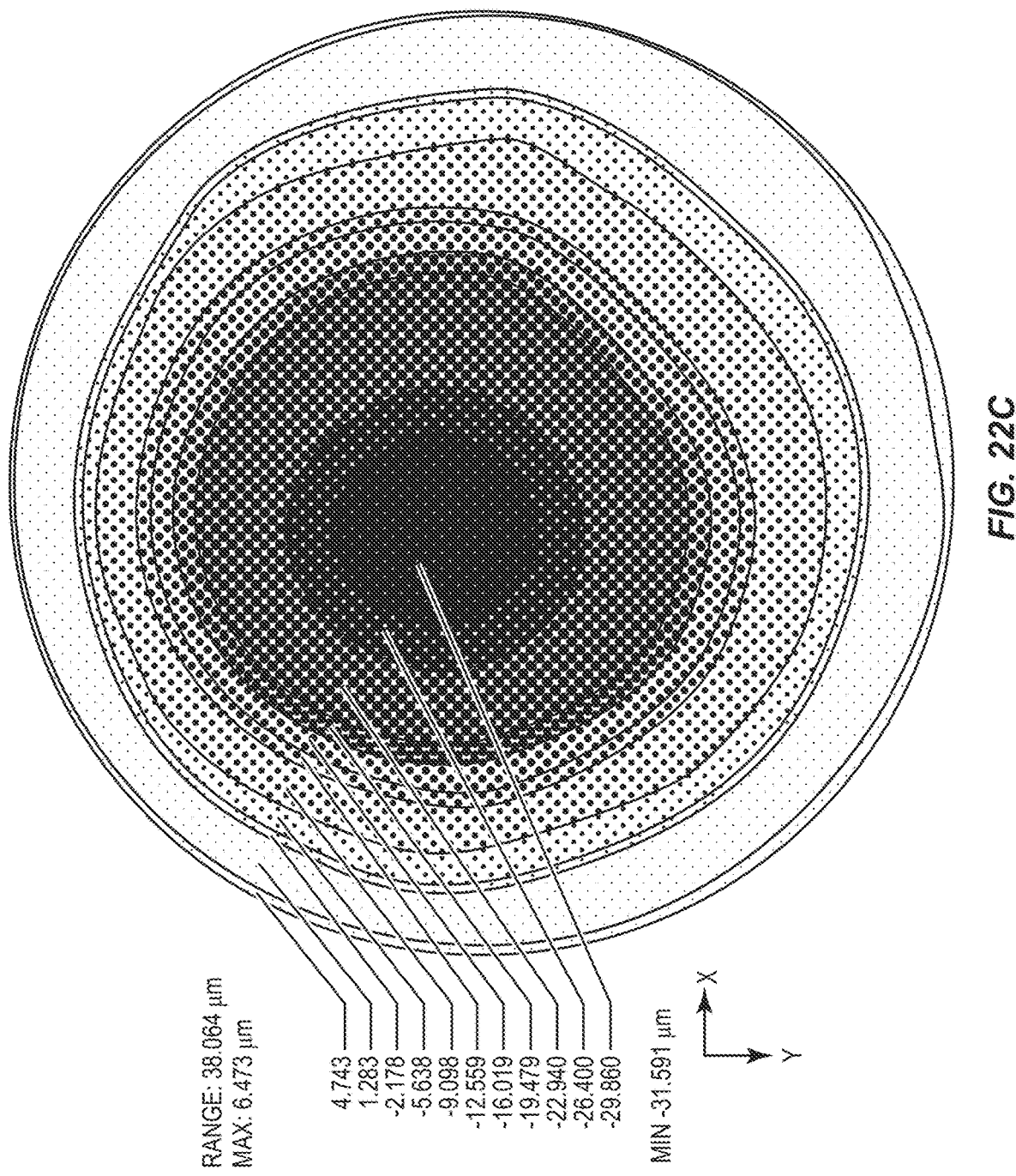
FIG. 22C is a contour plot illustrating edge-supported deviation values as measured for another SiC wafer that are used to determine deflection values according to embodiments disclosed herein.

FIG. 22C is a contour plot illustrating edge-supported deviation values as measured for another SiC wafer that are used to determine deflection values according to embodiments disclosed herein. For the purposes of the measurement, the SiC wafer was selected with a diameter of 200 mm and a thickness of 489 μm. The SiC wafer was arranged in an edge-supported configuration in a Tropel UltraSort automated wafer flatness analysis system where a sum of the distance X and the thickness $Y_1$ (FIG. 22A) was set at a value of 3 mm from the wafer edge. In FIG. 22C, various contour lines are illustrated to show how measured deviation values from a three-point focal plane differ across the SiC wafer. Additionally, specific deviation values are indicated at different points across the wafer to show how deviation values change within and across the contour lines. As illustrated, a minimum deviation value (Min) of −31.591 μm is indicated near a center of the SiC wafer and a maximum deviation value (Max) of 6.473 μm is indicated near a perimeter of the SiC wafer. As such, a maximum edge-supported deflection value for the SiC wafer of FIG. 22C may be defined as the spread between the Max and Min absolute values, or 38.064 μm. The maximum edge-supported deflection value may also be referred to as a ring warp for the SiC wafer. As previously described, wafer bow may be defined as a distance as measured at the center of an unclamped wafer between the surface of the wafer and the focal plane. In the edge-supported configuration of FIG. 22C, the center point of the wafer has a value of −29.956 μm below the focal plane. In this regard, the wafer of FIG. 22C comprises an edge-supported bow, or ring bow, of −29.956 μm.

Figure 22D:
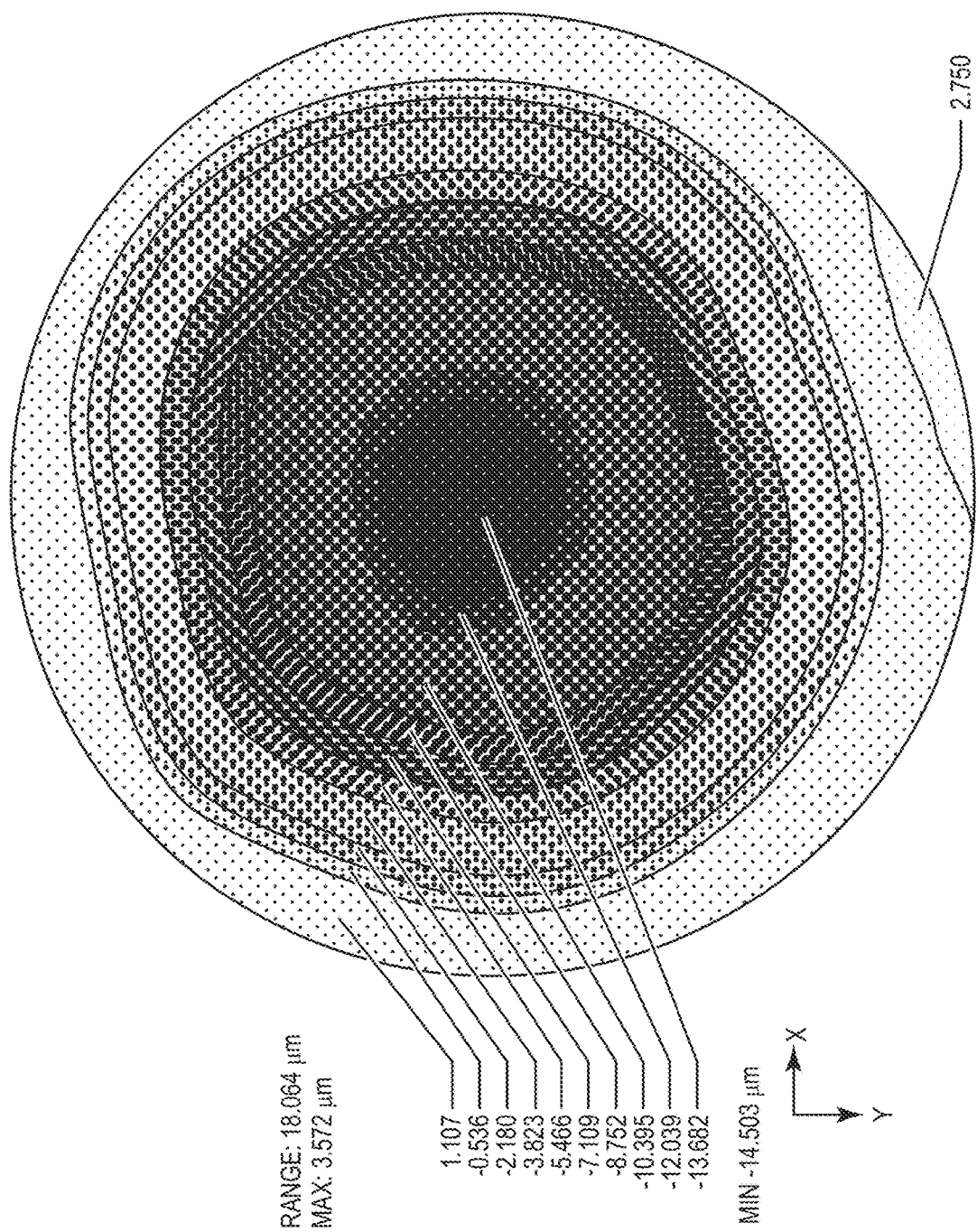
FIG. 22D is a contour plot illustrating edge-supported deviation values as measured for another SiC wafer that are used to determine deflection values according to embodiments disclosed herein.

FIG. 22D is a contour plot illustrating edge-supported deviation values as measured for yet another SiC wafer that are used to determine deflection values according to embodiments disclosed herein. For the purposes of the measurement, the SiC wafer was selected with a diameter of 200 mm and a thickness of 495 μm. The SiC wafer was arranged in an edge-supported configuration in a Tropel UltraSort automated wafer flatness analysis system where a sum of the distance X and the thickness $Y_1$ (FIG. 22A) was set at a value of 3 mm from the wafer edge. In FIG. 22D, various contour lines are illustrated to show how measured deviation values from a three-point focal plane differ across the SiC wafer. Additionally, specific deviation values are indicated at different points across the wafer to show how deviation values change within and across the contour lines. As illustrated, a minimum deviation value (Min) of −14.503 μm is indicated near a center of the SiC wafer and a maximum deviation value (Max) of 3.572 μm is indicated near a perimeter of the SiC wafer. As such, a maximum edge-supported deflection value, or ring warp, for the SiC wafer of FIG. 22D is measures as 18.075 μm. The center point of the SiC wafer of FIG. 22D is measured with a value of −14.469 μm below the focal plane. In this regard, the wafer of FIG. 22C comprises an edge-supported bow, or ring bow, of −14.469 μm.

Additional SiC wafers with diameters of at least approximately 200 mm and thicknesses in a range from 475 μm to 525 μm were provided and characterized as described in FIGS. 22C and 22D. Maximum edge-supported deflection values, or ring warp, were measured with values less than or equal to 50 μm, or less than or equal to 10 μm, or in a range from 5 μm to 150 μm, or in a range from 5 μm to 100 μm, or in a range from 5 μm to 50 μm, or in a range from 15 μm to 40 μm, or in a range from 5 μm to 20 μm. Edge-supported bow, or ring bow, was measured with values in a range from −5 μm to −50 μm, or in a range from −5 μm to −20 μm, or in a range from −5 μm to −10 μm. Standard bow and warp measurements were also collected in non-edge supported configurations. In this regard, non-edge supported bow measurements were provided in a range from −20 μm to 25 μm, or in a range from −5 μm to 5 μm, and non-edge supported warp measurements were provided in a range from 2 μm to 31 μm, or in a range from 2 μm to 15 μm.

Figure 22E:
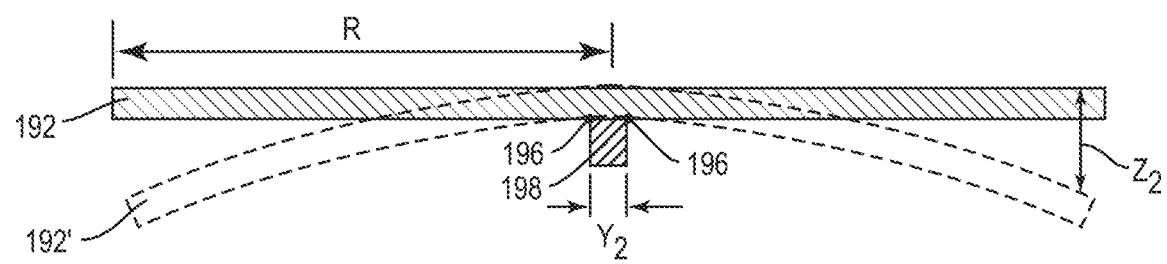
FIG. 22E is a side cross-sectional schematic view of a SiC wafer in a center-supported configuration for deflection characterization according to embodiments disclosed herein.

In an alternative configuration as illustrated in FIG. 22E, the SiC wafer 192 is arranged on a center support 198 that is registered with a center point of the SiC wafer 192, defined by a radius R. In this manner, deformation of the SiC wafer 192' may occur along perimeter edges such that center-supported deviation values $Z_2$ across the SiC wafer 192' may be measured. For a center-supported arrangement, the SiC wafer 192' may deform and contact the center support 198 along at least two contact points 196 that are spaced by a thickness $Y_2$ of the center support 198. In this manner, center-supported deflection values may be defined as the spread between maximum and minimum absolute center-supported deviation values $Z_2$.

Additionally, any of the above-described embodiments may be applicable to provide SiC wafers with intentional or imposed wafer shapes that are configured to reduce manufacturing problems associated with deformation, bowing, or sagging of such wafers due to gravitational forces or crystal stress. In this manner, effects associated with deformation, bowing, or sagging for SiC wafers, and in particular for large area SiC wafers, may be reduced when such SiC wafers are arranged with edge-supported configurations during subsequent manufacturing processes. As used herein, "positive bow" for a wafer generally refers to a shape that curves, bows, or warps outward from a device face of the wafer, e.g., a convex shape from the device face. As also used herein, a "relaxed positive bow" refers to a positive bow of a wafer that is established while any bending of the wafer due to gravitational forces is ignored. A SiC wafer generally forms a silicon face that opposes a carbon face, with a wafer thickness formed therebetween. In many semiconductor applications, devices are typically formed on the silicon face of the SiC wafer. Wafer bowing, warping, and the like occurs when one or more of the silicon face and the carbon face form surface deviation from a reference plane. As such, positive bow or relaxed positive bow for a SiC wafer generally refers to a shape that curves, bows, or warps outward from the silicon face of the SiC wafer, e.g. a convex shape from the silicon face. In certain embodiments, a shape of the carbon face may correspond to a positive bow or relaxed positive bow of the silicon face of the SiC wafer. In other embodiments, only the silicon face may form a positive bow or a relaxed positive bow. In certain embodiments, a SiC wafer comprises a relaxed positive bow in a range from greater than 0 μm to 50 μm, or from 0 μm to 40 μm, or from 0 μm to 15 μm, or from 30 μm to 50 μm, or from 8 μm to 16 μm. Exemplary (but not limiting) techniques and structures for providing and characterizing SiC wafers with relaxed positive bow is set forth in the commonly assigned U.S. patent application Ser. No. 16/415,721, which is hereby incorporated by reference herein.

In certain embodiments, wafer shape characteristics for large diameter SiC wafers may be improved by variably adjusting conditions for separating such SiC wafers from corresponding SiC crystal boules. As previously described, various structural defect profiles, doping profiles, and crystallographic stress profiles within crystalline materials can lead to undesirable shape characteristics for wafers that are separated from such crystalline materials. In this regard, wafer separation conditions may be variable adjusted as each subsequent wafer is being separated from a crystalline material to compensate for various structural defects and crystallographic stresses. In certain embodiments, an initial wafer may be separated from a crystalline material and characterized to determine one or more wafer shape characteristics, crystallographic defect profiles, doping profiles, and crystallographic stress profiles that may subsequently be used to variable adjust separation conditions for subsequent wafers formed from the same crystalline material. In certain embodiments, one or more crystallographic defect profiles, doping profiles, crystallographic stress profiles, and crystalline material shapes may be characterized for a crystalline material that may be used to predict wafer shape characteristics of freestanding wafers that are separated from the crystalline material and variable adjust separation conditions for actual wafers formed from the crystalline material. In certain embodiments, wafer separation conditions may be variable adjusted based on a shape of a top surface of the crystalline material. Accordingly, a feedback loop may be provided that adjusts or compensates separation conditions for SiC wafers from a SiC crystalline material based on one or more previously determined characteristics of the SiC crystalline material and/or an initial SiC wafer that has been separated from the SiC crystalline material. In this regard, a free-standing large diameter SiC wafer (e.g., at least approximately 200 mm) may have desirable flatness values of one or more of warp, bow, TTV, LTV, and SFQR based on a variable wafer separation process.

FIG. 23A is a side cross-sectional schematic view of a SiC crystal boule 200 with superimposed dashed lines indicating the location of an initial SiC wafer 202-1 that may be separated from the SiC crystal boule 200. FIG. 23B is a side cross-sectional schematic view of the initial SiC wafer 202-1 after separation from the SiC crystal boule 200. As illustrated, the initial SiC wafer 202-1 may have undesirable wafer shape characteristics after separation. As previously described, such wafer shape characteristics may at least partially be caused by one or more of variable defect profiles, doping profiles, or variable crystallographic stresses within the SiC crystal boule 200. As such, the initial SiC wafer 202-1 may be characterized for one or more properties including wafer shape characteristics, structural defects, doping profiles, and crystallographic stresses and such information may be used to adjust separation conditions for subsequent wafers that are separated from the initial SiC crystal boule 202-1. In this manner, the step of separating subsequent SiC wafers from the crystal boule 200 may be tailored or varied across the crystal boule 200 for compensation. In other embodiments, one or more properties including structural defects, doping profiles, and crystallographic stresses of the SiC crystal boule 200 may be characterized to predict wafer shape characteristics and determine how to adjust separation conditions for SiC wafers that will be separated from the SiC crystal boule 200.

FIG. 23C is a side cross-sectional schematic view of the SiC crystal boule 200 with superimposed dashed lines indicating a location of a subsequent SiC wafer 202-2 that may be separated from the SiC crystal boule 200 by a variable separation technique. As illustrated, the superimposed dashed lines in FIG. 23A are non-linear, indicating that a cutting depth across the SiC crystal boule 200 is variably adjusted based on one or more of variable defect profiles, doping profiles, or variable crystallographic stresses within the SiC crystal boule 200. By way of example, the shape of the superimposed dashed lines in FIG. 23C is illustrated as vertically inverse to the shape of the initial SiC wafer 202-1 of FIG. 23B.

FIG. 23D is a side cross-sectional schematic view of the subsequent SiC wafer 202-2 after separation from the SiC crystal boule 200. By variably cutting the subsequent SiC wafer 202-2 in such a manner, the subsequent SiC wafer 202-2 may be separated from the SiC crystal boule 200 with improved wafer shape characteristics in a relaxed state as compared to the initial SiC wafer 202-1 of FIG. 23B. In certain embodiments, the cutting depth for the subsequent SiC wafer 202-2 may be variably adjusted based on wafer shape characteristics of the initial SiC wafer 202-1 that was previously separated from the SiC crystal boule 200. In other embodiments, the cutting depth for the subsequent SiC wafer 202-2 may be variably adjusted based on a shape (e.g., a convexity) of a top surface 200' of the SiC crystal boule 200 before the subsequent SiC wafer 202-2 is separated, in addition to or in place of wafer shape characteristics of the initial SiC wafer 202-1. In still other embodiments, the cutting depth for the subsequent SiC wafer 202-2 may be variably adjusted based on defect profiles, doping profiles, or stress profiles of one or more of the initial SiC wafer 202-1 or the SiC crystal boule 200. The variable cutting depths may comprise laser-assisted separation by providing focused laser emissions within and across the SiC crystal boule 200, followed by application of a force to separate the subsequent SiC wafer 202-2 along the focused laser emission regions. In other embodiments, the variable cutting depths may be provided by a mechanical sawing process.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A silicon carbide (SiC) wafer comprising:
   a diameter of at least 195 millimeters (mm);
   a thickness in a range from 300 microns (μm) to 1000 μm; and
   a total thickness variation (TTV) of less than 7 μm, wherein the TTV is defined as difference between a maximum elevation and a minimum elevation of a front surface of the wafer relative to a back surface of the wafer.

2. The SiC wafer of claim 1, wherein the total thickness variation (TTV) is less than 2.6 μm.

3. The SiC wafer of claim 1, wherein the total thickness variation (TTV) is less than 2.2 μm.

4. The SiC wafer of claim 1, wherein the total thickness variation (TTV) is measured when the wafer is clamped.

5. The SiC wafer of claim 1, wherein the total thickness variation (TTV) is measured when the wafer is held in place by a vacuum chuck applied at the back surface of the wafer.

6. The SiC wafer of claim 1, wherein the diameter is in a range from 195 mm to 455 mm.

7. The SiC wafer of claim 1, wherein the diameter is in a range from 195 mm to 305 mm.

8. The SiC wafer of claim 1, wherein the thickness is in a range from 300 to 500 μm.

9. The SiC wafer of claim 1, wherein the thickness is in a range from 300 to 800 μm.

10. The SiC wafer of claim 1, further comprising a local thickness variation (LTV) of less than 4 μm for a site area of 1 cm2, wherein the LTV is defined as a difference in a local maximum elevation and a local minimum elevation of a front surface relative to a back surface for the site area of the wafer when the wafer is held in a clamped state.

11. The SiC wafer of claim 1, further comprising a site front least-squares (SFQR) maximum value of less than 1.5 µm for a site area of 1 cm2, wherein the SFQR for the site area is defined as a sum of the absolute value of a maximum distance from a localized focal plane to a surface of the wafer above the localized focal plane and a maximum distance from the localized focal plane to a surface of the wafer below the localized focal plane, wherein the localized focal plane is defined by a local least squares fit for the site area.

12. The SiC wafer of claim 1, wherein the SiC wafer comprises 4-H SiC.

13. The SiC wafer of claim 1, wherein the SiC wafer comprises semi-insulating SiC.

14. The SiC wafer of claim 1, wherein the SiC wafer comprises n-type SiC.

15. The SiC wafer of claim 14, wherein the SiC wafer comprises nitrogen for an n-type dopant.

16. The SiC wafer of claim 15, wherein the n-type dopant forms a higher doping region and a lower doping region such that the higher doping region is laterally bounded the lower doping region.

17. The SiC wafer of claim 16, wherein the higher doping region is registered with a central region of the SiC wafer.

18. The SiC wafer of claim 16, wherein the higher doping region is offset from a central region of the SiC wafer.

19. The SiC wafer of claim 15, wherein the SiC wafer further comprises at least one of boron, aluminum, germanium, beryllium, gallium, tin, arsenic, phosphorus, titanium, and vanadium.

20. A silicon carbide (SiC) wafer comprising:
a diameter of at least 195 millimeters (mm);
a thickness in a range from 300 microns (µm) to 1000 µm; and
a local thickness variation (LTV) of less than 4 µm for a site area of 1 cm2, wherein the LTV is defined as a difference in a local maximum elevation and a local minimum elevation of a front surface relative to a back surface for the site area of the wafer.

\* \* \* \* \*